United States Patent [19]
McMillan et al.

[11] Patent Number: 5,650,593
[45] Date of Patent: *Jul. 22, 1997

[54] THERMALLY ENHANCED CHIP CARRIER PACKAGE

[75] Inventors: John R. McMillan, Southlake; William H. Maslakow, Lewisville; Abram M. Castro, Fort Worth, all of Tex.

[73] Assignee: Amkor Electronics, Inc., West Chester, Pa.

[ * ] Notice: The term of this patent shall not extend beyond the expiration date of Pat. No. 5,471,011.

[21] Appl. No.: 383,966

[22] Filed: Feb. 6, 1995

Related U.S. Application Data

[63] Continuation-in-part of Ser. No. 339,329, Nov. 14, 1994, which is a continuation-in-part of Ser. No. 250,153, May 26, 1994, Pat. No. 5,471,011.

[51] Int. Cl.$^6$ ............... H01L 23/02; H01L 23/28; H05K 7/20; H05K 1/18
[52] U.S. Cl. .......... 174/52.4; 174/52.2; 361/709; 361/714; 361/743; 361/718; 361/760; 361/761; 361/772; 257/698; 257/700; 257/704; 257/706; 257/707; 257/720; 257/734; 257/779; 257/787
[58] Field of Search ............. 29/827, 830–832, 29/841, 855; 174/52.1–52.4; 257/666, 673, 676, 678, 685, 698, 700, 701, 702, 704, 706, 707, 717, 720, 734, 746, 779, 787; 361/600, 709, 714, 718, 719, 736, 743, 772, 773, 760–761

[56] References Cited

U.S. PATENT DOCUMENTS

| | | | |
|---|---|---|---|
| Re. 29,325 | 7/1977 | Hargis | 174/52 S |
| 3,644,798 | 2/1972 | Ihochi | 317/234 R |
| 3,790,859 | 2/1974 | Schraeder et al. | 317/100 |
| 3,867,759 | 2/1975 | Siefker | 29/628 |
| 4,195,193 | 3/1980 | Grabbe et al. | 174/52 FP |
| 4,480,262 | 10/1984 | Butt | 357/74 |
| 4,507,907 | 4/1985 | Wolfson | 53/478 |
| 4,509,096 | 4/1985 | Baldwin et al. | 361/386 |
| 4,521,801 | 6/1985 | Kato et al. | 357/71 |
| 4,630,172 | 12/1986 | Stenerson et al. | 361/386 |
| 4,700,276 | 10/1987 | Freyman et al. | 361/403 |
| 4,823,234 | 4/1989 | Konishi et al. | 361/386 |

(List continued on next page.)

FOREIGN PATENT DOCUMENTS

| | | |
|---|---|---|
| 57-194556 | 11/1982 | Japan . |
| 59-188948 | 10/1984 | Japan . |
| 60-127747 | 7/1985 | Japan . |
| 60-198818 | 10/1985 | Japan . |
| 61-114563 | 6/1986 | Japan . |
| 62-81735 | 4/1987 | Japan . |
| 61-48950 | 3/1986 | Japan . |
| 27545 | 1/1990 | Japan . |
| 3261165 | 11/1991 | Japan . |
| 4142068 | 5/1992 | Japan . |

OTHER PUBLICATIONS

Q.K. Kerjilian & G.C. Phillips, Jr./ *Thermally Enhanced Multi layer Ceramic Substrate Structure*/ IBM Corporation/ Jul. 1975/ vol. 18, No. 2.

E. Berndlmaier & J.A. Dorler / *Semiconductor Package with Improved Cooling*/ IBM Corporation / Feb. 1978 / vol. 20, No. 2.

*Primary Examiner*—Bot L. Ledynh

[57] ABSTRACT

A thermally enhanced chip carrier package with a built-in heat sink for semi-conductor integrated circuit chips. A circuit substrate is formed of a suitable thermoplastic such as PPS or LCP with a center opening and a metal attachment ring for attaching a heat sink to either the top or bottom thereof with solder. A casing is further formed on the substrate outwardly of the aperture and the heat sink mounted thereacross, the casing being comprised of the suitable thermoplastic and being chemically fused to a portion of the circuit substrate to create a moisture seal therebetween. An encapsulant for filling the cavity within the casing and a lid may also be utilized to further secure and seal the chip mounted to the heat sink secured therein.

31 Claims, 18 Drawing Sheets

U.S. PATENT DOCUMENTS

| | | | |
|---|---|---|---|
| 4,843,695 | 7/1989 | Doe et al. | 29/827 |
| 4,868,349 | 9/1989 | Chia | 174/52.4 |
| 4,876,588 | 10/1989 | Miyamoto | 357/81 |
| 4,878,108 | 10/1989 | Phelps, Jr. et al. | 357/81 |
| 4,887,149 | 12/1989 | Romano' | 357/81 |
| 4,890,152 | 12/1989 | Hirata et al. | 357/72 |
| 4,894,709 | 1/1990 | Phillips et al. | 357/82 |
| 4,910,583 | 3/1990 | Behr et al. | 357/81 |
| 4,940,181 | 7/1990 | Juskey, Jr. et al. | 228/180.2 |
| 4,965,660 | 10/1990 | Ogihara et al. | 357/81 |
| 4,978,638 | 12/1990 | Buller et al. | 437/209 |
| 5,006,673 | 4/1991 | Freyman et al. | 174/255 |
| 5,027,191 | 6/1991 | Bourdelaise et al. | 357/74 |
| 5,152,057 | 10/1992 | Murphy | 29/883 |
| 5,155,579 | 10/1992 | Au Yueng | 357/787 |
| 5,194,695 | 3/1993 | Maskalow | 174/52.4 |
| 5,241,133 | 8/1993 | Mullen, III et al. | 174/52.4 |
| 5,254,500 | 10/1993 | Au Yeung | 437/214 |
| 5,278,446 | 1/1994 | Nagaraj et al. | 257/707 |
| 5,293,301 | 3/1994 | Tanaka et al. | 361/707 |
| 5,328,870 | 7/1994 | Marrs | 437/216 |
| 5,345,106 | 9/1994 | Doering et al. | 257/675 |
| 5,355,283 | 10/1994 | Marrs et al. | 361/760 |
| 5,357,673 | 10/1994 | Newman | 29/830 |
| 5,371,404 | 12/1994 | Juskey et al. | 257/659 |
| 5,378,869 | 1/1995 | Marrs et al. | 219/121.71 |

"GAS TIGHT" LID SEAL

"GAS TIGHT" CUP SEAL

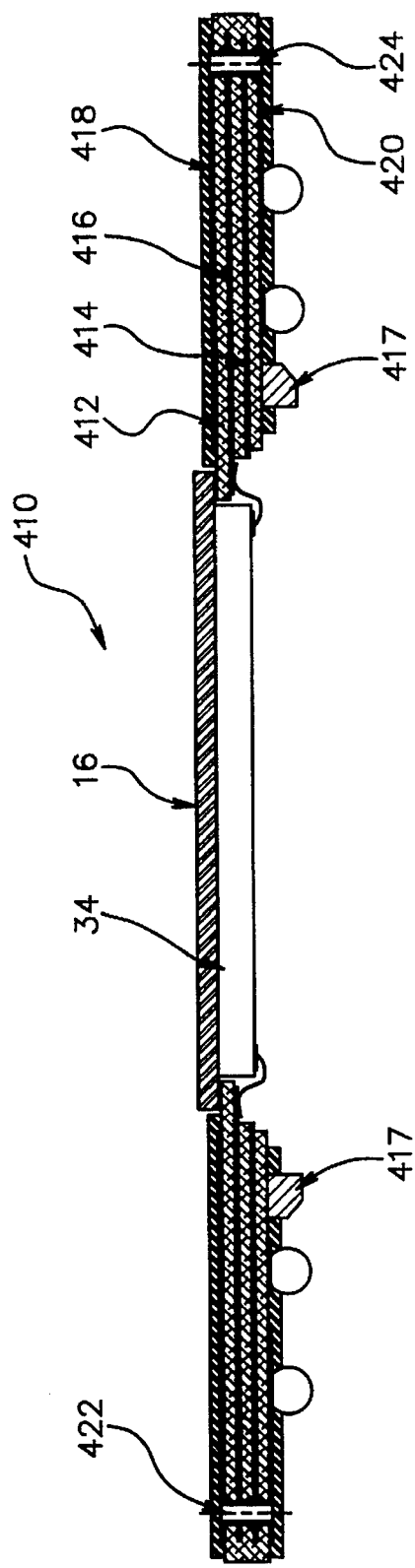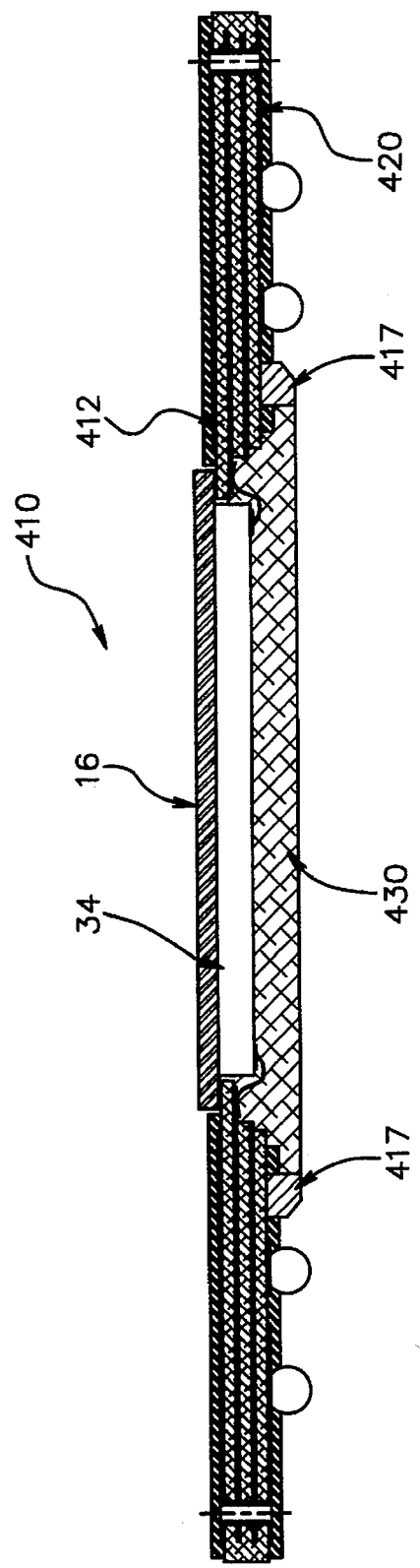
FIG. 17A
FIG. 17B

THERMALLY ENHANCED CHIP CARRIER PACKAGE

This patent application is a continuation-in-part of U.S. patent application Ser. No. 08/339,329, filed Nov. 14, 1994, which is a continuation-in-part of U.S. patent application Ser. No. 08/250,153, filed May 26, 1994, now U.S. Pat. No. 5,471,011, assigned to the assignee of the present invention.

BACKGROUND OF THE INVENTION

1. Field of the Invention

The present invention relates generally to chip carrier packages for semi-conductor integrated circuit chips and, more particularly, to a thermally enhanced homogeneous chip carrier package for integrated circuit chips.

2. Description of Related Art

It is conventional in the electronic industry to encapsulate one or more semiconductor devices such as integrated circuit chips in chip carrier packages. In doing so, heat dissipation can become an important design consideration. Chip carrier packages usually seal a chip or chips within insulative plastics or resins. This protects the chip from environmental hazards as well as providing a means for electrically and mechanically attaching the chip to an intended device. A primary focus in the design of such a chip carrier package where heat dissipation is a concern is to provide the chip with adequate protection from the external environment and to provide an adequate heat conduction conduit to carry heat away from the chip during operation.

Prior art approaches to such chip carrier packages include two major design areas. The first area is the provision for adequate protection from the external environment. The second area is the provision of a heat sink or other heat dissipation means for the chip. These areas may both be seen in designs for total encasement chip carrier packages (TE package). The TE package generally includes a lead frame having a chip mounting pad, an integrated circuit chip which is attached to the chip mounting pad, a plurality of fragile wires which connect the chip to the lead frame, and a thermoset plastic which totally encases the lead frame, the chip and the plurality of fragile wires. It may also include a heat sink (HS) or similar heat dissipation means. The TE package alone has several problems which arise from the thermoset plastic's direct contact with the chip and the plurality of fragile wires. First, the thermoset plastic is in direct contact with the plurality of fragile wires, which connect the chip to the lead frame. The molding process may cause a disruption of the planarity or spacing of the fragile wires, which can produce electrical shorting of the plurality of fragile wires, thus resulting in chip failure or damage. Second, different coefficients of thermal expansion exist for the chip, the lead frame, the plurality of fragile wires and the thermoset plastic. Materials having different coefficients of thermal expansion expand and contract at different rates during temperature variations. Temperature variations are produced during the molding process of the TE package, during final solder attachment of the TE package to the intended device board and during the operation of the chip within the TE package. The temperature variations provide the possibility for disassociation of the thermoset plastic from the chip and the plurality of fragile wires. Disassociation of the thermoset plastic from the chip and the plurality of fragile wires produces chip failure and/or damage resulting from wire stress failure or wire bond connection failure. The temperature variations further provide the possibility for the formation of voids. Third, the thermoset plastic utilized in the manufacture of the TE package exhibits hygroscopic properties. The hygroscopic properties of the TE package allow moisture to enter and accumulate in the formed voids. High temperatures are required during the final solder attachment of the TE package to the intended device. The high temperatures can convert the moisture, located within the formed voids, into steam, thereby expanding and cracking the TE package or the chip.

Addressing now heat dissipation for TE packages, a variety of prior art techniques have been utilized. The most conventional technique of heat dissipation in the electronic industry is the use of a heat sink. Such devices have been used in both small and large electronic units, the most common of which being consumer dimmer switches. With the complexity of small, sophisticated semiconductor devices, other problems arise which are exacerbated by the requirement to encapsulate the chip. The partial solution to these problems may be seen in a variety of prior art patents. One such approach is seen in U.S. Pat. No. 4,888,449 to Crane et al. The Crane et al. approach utilizes a base member having an expanded surface area, such as grooves, to provide an additional area for heat transfer. Another approach is seen in U.S. Pat. No. 4,887,149 to Romano, which teaches the use of a metal base plate heat sink mounted to a suitable external heat sink. The criticality of heat dissipation may thus be seen by the utilization of such heat dissipation approaches. Problems of course arise by the utilization of metal slugs disposed in direct association with the chip when the metal slug must be encapsulated in the plastic package therearound. The encapsulation of the chip is, however, of primary import, which leads to the problem of the differences in the thermal coefficient of expansion between the materials. One approach to overcoming the problem of differential thermal coefficients of expansion is the utilization of the plastic material itself as a heat dissipation member. This approach is set forth and shown in U.S. Pat. No. 5,254,500 wherein a plurality of molded members upstand from the top of the plastic package for direct heat dissipation from the chip encapsulated therein.

Another prior art approach for designing a chip carrier package to provide adequate protection from the external environment is a cavity package. The cavity package generally includes a lead frame having a plurality of lead members and a chip mounting pad, an integrated circuit chip attached to the chip mounting pad, a plurality of fragile wires which connect the chip to the plurality of lead members, a thermoset plastic which is formed around the lead frame and the chip mounting pad in such a manner as to provide a cavity, and a thermoset molded lid which is attached to the cavity by a thermoset adhesive. The cavity package has several problems associated with its manufacture. First, some of the plurality of lead members have their planarity compromised during the process of molding or injecting the thermoset plastic around the lead frame and the chip mounting pad. Each one of the plurality of lead members which has its planarity compromised increases the difficulty in connecting an associated fragile wire from the chip to the compromised lead member. Second, during the molding or injecting process, the chip mounting pad and the plurality of lead members may also be partially, or in some cases, totally, covered with the thermoset plastic material, causing extensive cleaning steps to remove the thermoset plastic material prior to connecting the plurality of fragile wires. Molding apparatus systems have been designed to address certain of these issues. However, the molding apparatus systems are expensive and require costly maintenance. Third, the thermoset plastic which is utilized in the manufacture of the cavity package exhibits hygroscopic properties. The hygroscopic properties of the thermoset plastic allow moisture to enter the cavity. Chemical leaching is produced from the contact of the moisture with the thermoset plastic within the cavity. Leached chemicals, within the cavity, can be in contact with the plurality of fragile wires and/or chip. The leached chemicals can result in the shorting of the plurality of fragile wires, thus producing chip failure. High temperatures are generated within the cavity during the process of attaching the cavity package to an intended device and during the operation of the chip. The generated high temperatures convert moisture within the cavity to steam, thereby expanding and cracking the thermoset molded lid and/or damage to the chip.

Other design issues are present in the prior art with regard to these semiconductor packaging approaches. This is because not all TE packages or cavity packages utilize lead frame arrays. The utilization of leadless circuit carrying insulating substrates has found approval in the semiconductor industry and may in certain instances further complicate heat dissipation issues by further reducing the amount of heat that will be carried away from the chip by the lead frame itself. For example, it is well known that heat generated in a semiconductor chip is dissipated to some extent through the leads extending from the integrated circuit package. When a leadless circuit carrying substrate is utilized, this avenue of heat dissipation is further limited although metal surface traces do carry away some heat when said traces are properly exposed.

A prior approach for a leadless chip carrier package which does not specifically address chip heat dissipation is set forth in as shown in U.S. Pat. No. 5,241,133 assigned to Motorola Inc. This patent teaches a leadless pad array chip carrier package wherein a protective plastic cover is transfer molded about the semiconductor device covering substantially all the top side of a printed circuit board with the bottom side having an array of solder pads which may include solder balls. The leadless pad array chip carrier package comprises a leadless circuit carrying insulating substrate being adapted for the mounting of a semiconductor device on one side thereof. The underside includes a plurality of surface mount solder pads electrically connected to the semiconductor device by means of plated through holes extending through the leadless circuit carrying substrate. The holes are positioned away from the solder pads. The assembly further includes a protective cover consisting of a resin transfer molded about the semiconductor device.

As stated above, resin coated surfaces are not always acceptable for end users of semiconductor devices and moisture infiltration is a constant concern with regard to the fabrication of all chip carrier packages. Differentials in the thermal coefficient of expansion between resin coatings and circuit substrates can be a problem due to the nonhomogeneous material interface therebetween. Any nonhomogeneity can subject the package to thermal cracking and comprise an area for moisture infiltration. Chip carrier packages having the advantages of certain prior art devices, such as integral heat sink assemblies, but constructed of a single homogenous material would therefore be a marked advantage over the prior art.

It would be an advantage therefore to have a thermally enhanced, homogeneous chip carrier package including a heat sink assembly (HC-HS package) for conventional lead frame and land grid array (LGA) and ball grid array (BGA) assemblies. The present invention provides such a package with a chip mounting cavity, heat sink and electrical contact points disposed on a circuit substrate in LGA and BGA assemblies which utilize the same heat sink for the various integral attachments of the HC package. Since the various integral attachments such as a cavity lid may all be comprised of the same thermoplastic as the HC-HS package, chemical bonding or fusing of the integral attachments to the HC-HS package may be utilized to provide protection of the chip from the external environment. The HC-HS package of the present invention eliminates many of the prior art problems associated with semiconductor heat sink assemblies and chip packages having different coefficients of thermal expansion therein. The present design also reduces the possibility of moisture entering the vicinity of the chip either through the package material or around the heat sink.

SUMMARY OF THE INVENTION

The present invention relates to a thermally enhanced homogeneous chip carrier package for semiconductor integrated circuit chips. More particularly, one aspect of the present invention includes a circuit substrate formed of a suitable thermoplastic with a center opening and a metal ring upon which solder is placed for attaching a heat sink thereto for exposure therethrough. The heat sink may be constructed with at least one chip mounting pad. The substrate may also be formed with a plurality of lead traces, each of which being located so as to provide electrical isolation from each other. Electrical contact points are disposed on the top or bottom of the circuit substrate and means are provided for connecting the lead traces to the contact points. A casing is further provided which is comprised of the suitable thermoplastic, and covers a portion of the circuit substrate and the connecting means so that a cavity is formed. The casing is chemically fused to a portion of the circuit substrate.

In another aspect, the above described invention includes a lid which may be comprised of a variety of materials including metal, the suitable thermoplastic or the like, and secured to the casing.

In yet another aspect, the present invention includes a method of manufacturing a thermally enhanced chip carrier cavity package and heat sink assembly which includes the steps of forming a circuit substrate with a suitable thermoplastic and etching a defined circuit pattern on the circuit substrate. The method further includes the steps of forming the substrate with a center cut-out for exposing the heat sink and providing a metal ring upon which solder is placed for attaching the heat sink thereto. A casing is formed of the suitable thermoplastic and is molded to cover outer portions of the circuit substrate. The casing is chemically bonded to a portion of the circuit substrate blocking moisture passage therethrough. The above-described method also includes the step of securing one or more chips to the heat sink in the cut-out of the circuit substrate.

BRIEF DESCRIPTION OF THE DRAWINGS

For a more complete understanding of the present invention and for further objects and advantages thereof, reference may now be had to the following description taken in conjunction with accompanying drawings, in which:

FIG. 17A is a side-elevational, cross-sectional view of an alternative embodiment of the present invention illustrating a multi-layer configuration of the assembly of FIG. 16A; and FIG. 17B is a side-elevational, cross-sectional view of an alternative embodiment illustrating a multi-layer configuration of the assembly of FIG. 16B.

DETAILED DESCRIPTION

Figure 1A:
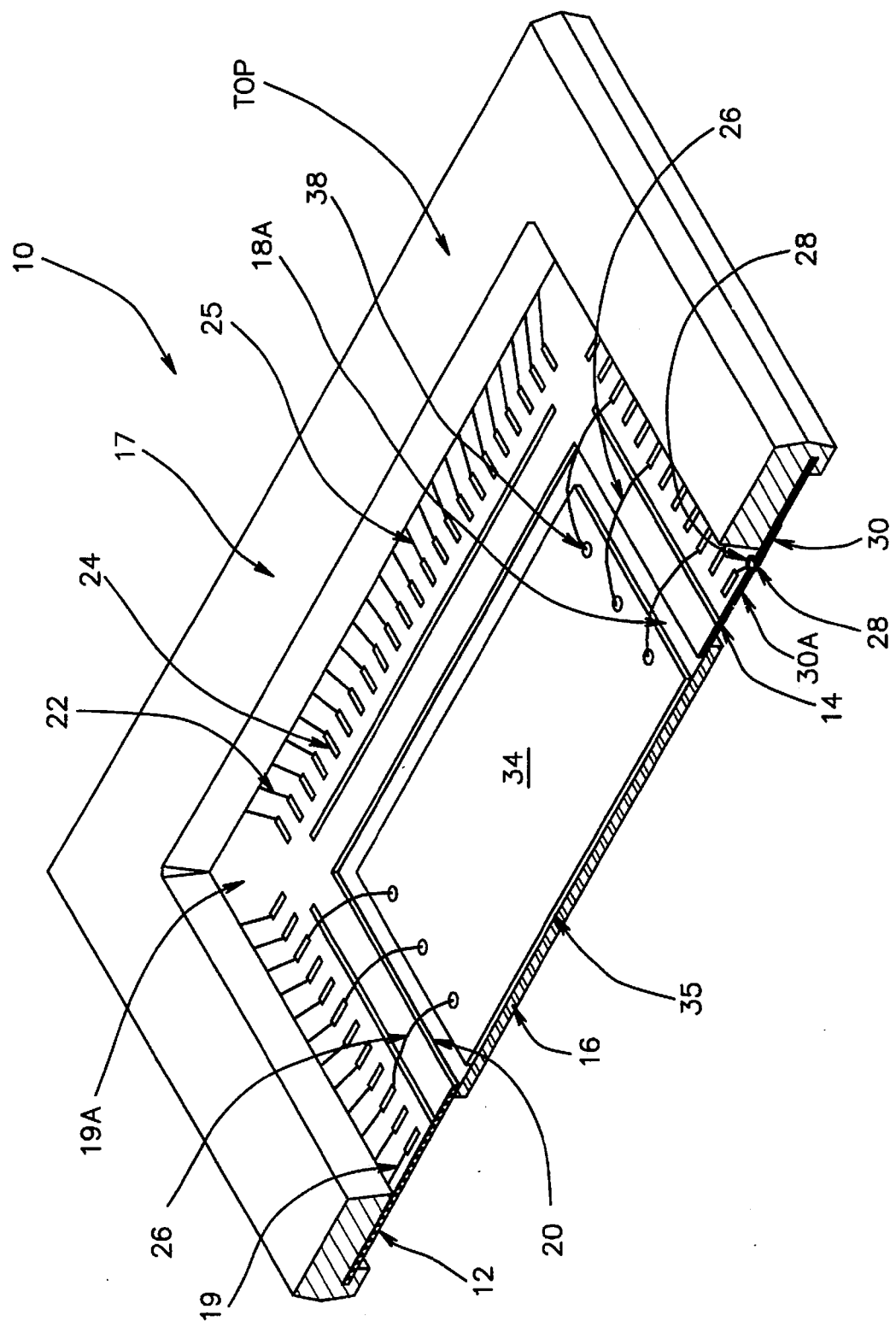
FIG. 1A is a cross-sectional, perspective view of the top side of one embodiment of a thermally enhanced chip carrier package constructed in accordance with the principles of the present invention.

Referring first to FIG. 1A there is shown one embodiment of a thermally enhanced chip carrier cavity package constructed in accordance with the principles of the present invention. The thermally enhanced chip carrier package 10 is shown in a cross-sectional, perspective view of the top thereof and is constructed for receipt of one or more suitable semiconductor devices, herein referred to as a chip or die. The chip carrier package 10 includes a circuit substrate or board 12 formed of a suitable thermoplastic 14 having a casing 17 formed therearound and a center section cut-out 18A which exposes a heat sink 16 therethrough. The substrate 12 is fabricated with a plurality of lead traces 22 extending from the region around a cut-out 18A. Each of the lead traces 22 is located so as to provide electrical isolation from each other and the heat sink 16. In this particular configuration, an advancement over the prior art is provided in a configuration including a secured heat sink and substrate adapted for sealing one or more chips 34 secured thereon from moisture in a reliable and efficient package. The assembly described herein has these features and is economical to fabricate. After the attachment of the chip 34, a plurality of fragile wires 26 are, in one embodiment, connected between the plurality of inner lead traces 22 and a plurality of electrical connection pads 38 of the chip 34.

Referring still to FIG. 1A, the manufacture of the chip carrier package 10 is accomplished by first producing a circuit substrate 12. The circuit substrate 12 may comprise a resinous printed circuit board made of suitable thermoplastic such as polyphenylene sulfate (PPS) or liquid crystal polymer (LCP). The fabrication of such printed circuit boards is a well established technology and may include multilayer boards having multiple metal layers therein (as discussed below). Conventional printed circuit boards have metal patterns on at least one side and often on opposite sides thereof. Some have plated through holes extending between the metal patterns on opposite sides of the board. The present invention utilizes metal patterns formed on one or both sides of the board and sometimes within the board through a process of either subtractive or additive etching. Plated through holes may also be formed.

The above referenced etching process can form a multitude of circuits, pads and related elements, including defined circuit patterns. The patterns can be on the top or bottom of the substrate, depending on the design. For example, FIG. 1A shows a pattern 19 on the top side 19A of substrate 12. The pattern 19 includes electrical conductive lead traces 22. Each one of the plurality of lead traces 22 on top side 19A includes an inner lead trace finger 24, an intermediate trace finger 25 and a plated through hole 28 which extends to a portion of the metal pattern 30 formed on the bottom side 30A of board 12. The lead traces 22 are formed during the etching process so that electrical isolation is provided between each one of the plurality of lead traces 22 and portions of pattern 30 (to be discussed below). During the etching process, a heat sink mounting ring 20 formed of metal and adapted for solder coating is also formed on the bottom side 30A of substrate 12 in a completely enclosing shape around cut-out 18A so that the heat sink 16 can be solder mounted thereto in sealed engagement therewith.

Figure 1B:
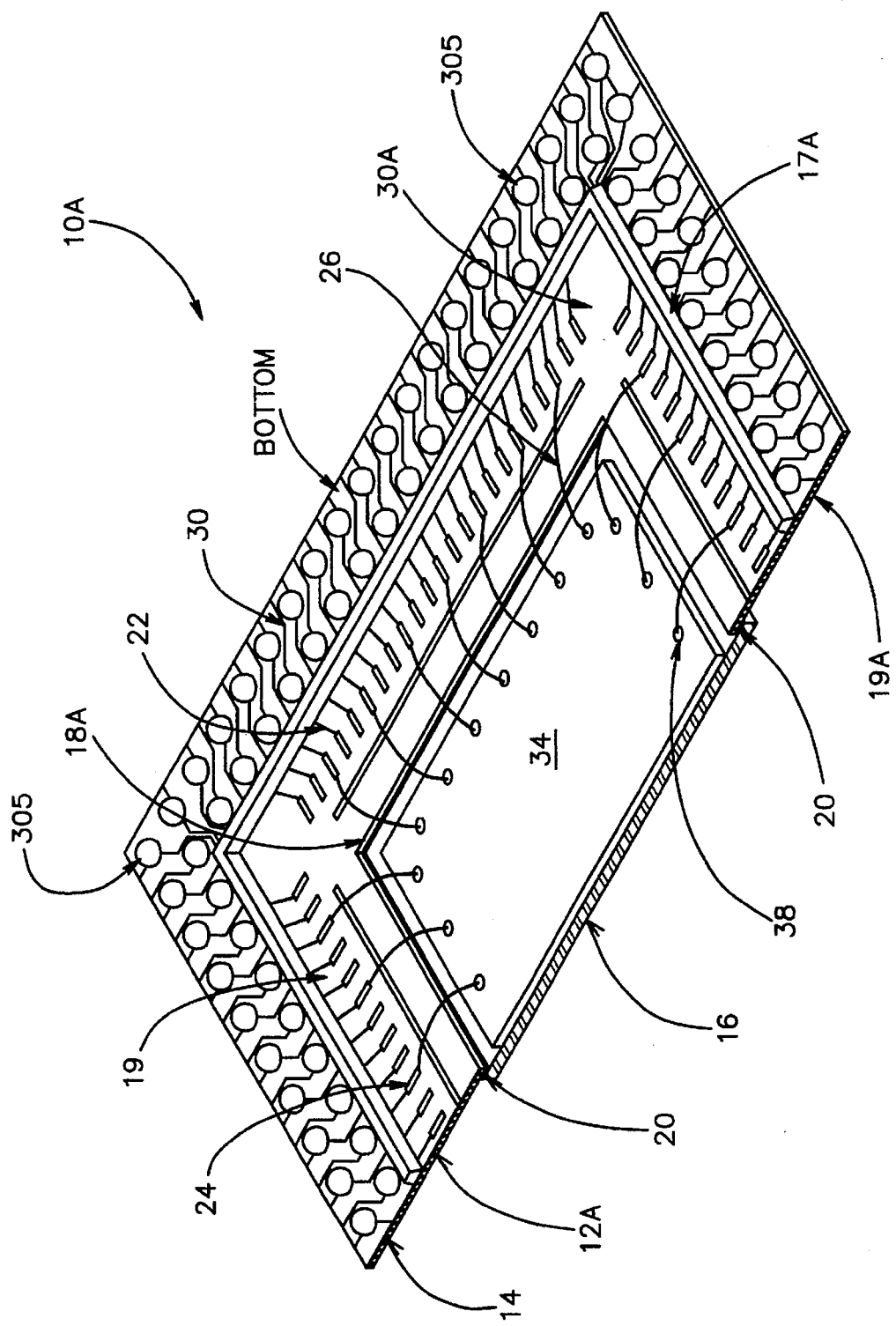
FIG. 1B is a cross-sectional, perspective view of the bottom side of another embodiment of the package of FIG. 1A.

Referring now to FIG. 1B, there is shown a perspective view of the bottom side of an alternative embodiment of a thermally enhanced chip carrier cavity package 10A constructed in accordance with the principles of the present invention. Package 10A includes a circuit substrate, or board, 12A formed of a suitable thermoplastic 14 having a segmented casing 17A in the form of a resin dam formed around a center cut-out 18A which exposes a heat sink 16 therethrough. The substrate 12A is fabricated with a plurality of lead traces 22 extending from the board region around cut-out 18A. Each of the lead traces 22 is located so as to provide electrical isolation from each other and the heat sink 16. As with the above-described package of FIG. 1A, an advancement over the prior art is provided with regard to the attachment of heat sink 16. Unlike the configuration of FIG. 1A, however, the heat sink 16 is assembled to the top 19A of the substrate 12A rather than the bottom.

Referring still to FIG. 1B, the heat sink 16 is secured to the top 19A of substrate 12A by a heat sink mounting ring 20 as described above. The heat sink mounting ring 20 is formed on the top side 19A of substrate 12A in a generally rectangular shape which surrounds cut-out 18A so that the heat sink 16 can be solder-mounted thereto in a sealed engagement therewith. The ring 20 may comprise a metal layer which has been etched thereon. The chip 34 is then secured to the heat sink 16 with adhesive, or the like, while fragile wires 26 extend outwardly from connection pads 38 of the chip to inner lead trace fingers 24 of lead traces 22. Unlike FIG. 1A, the circuit pattern 19 appears only on the bottom side 30A of the substrate 12A with all lead traces 22 extending beneath the segmented casing 17A to electrically connect solder balls 305 to the appropriate connection pad 38. Other chip designs, such as flip chips, and chip configurations, such as multiple chips in a single board 12A, may be utilized in the package 10A. Such chip designs and configurations are more fully set forth in co-pending patent application Ser. No. 08/339,329. It may be seen that in this particular embodiment, the chip 34 and fragile wires 26 are configured for securement within an encapsulant retained by the segmented casing 17A, as will be described in more detail below. As described in FIG. 1A, this particular configuration also positions the heat sink 16 for the mounting of, and heat dissipation for, the chip 34. Unlike the arrangement of FIG. 1A, however, the chip 34 will be inverted relative to the mounting as the substrate 12A to the appropriate mother board, or the like (not shown).

Figure 2:
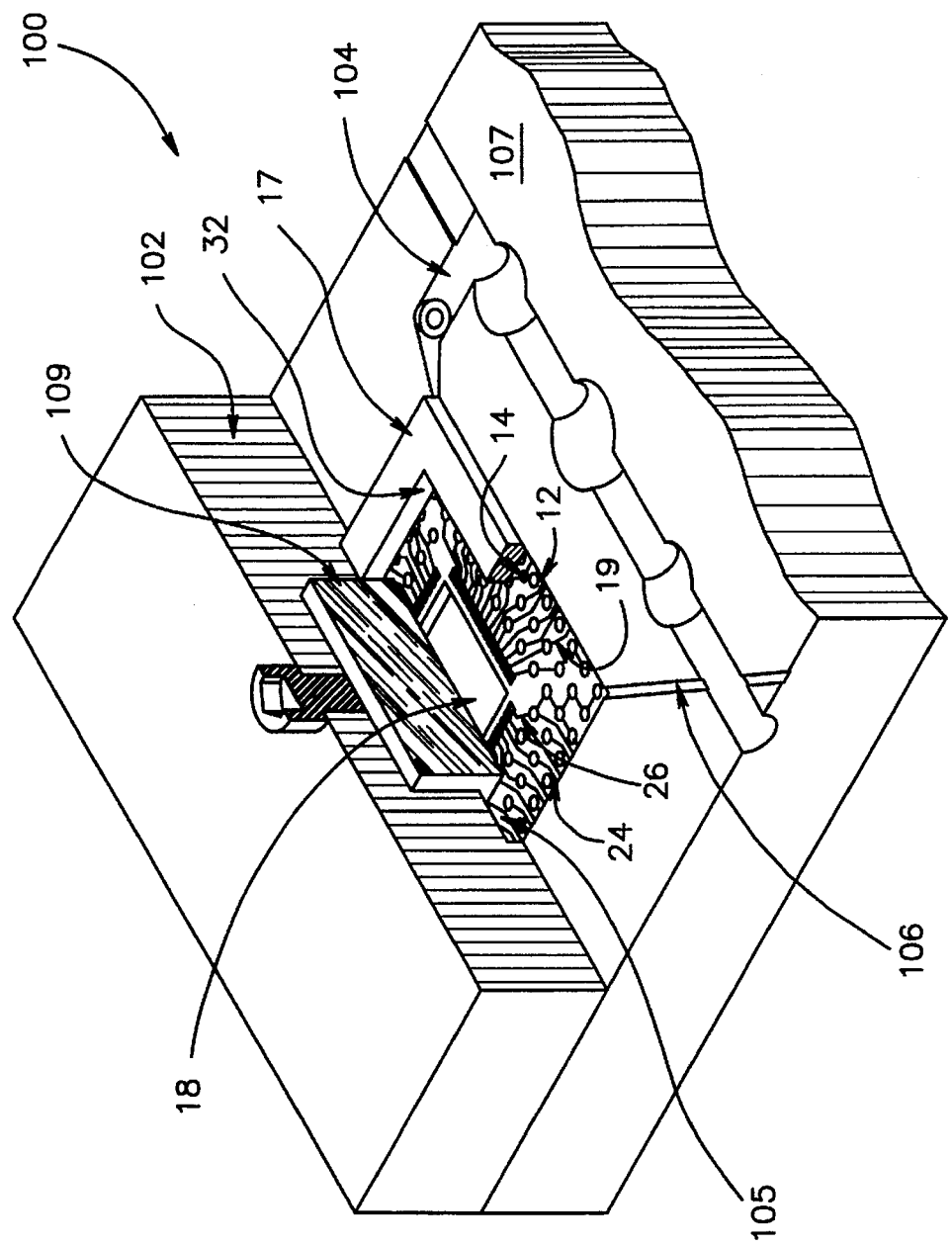
FIG. 2 is a fragmentary, perspective view of a method of and apparatus for molding the thermally enhanced chip carrier package of the present invention.

Referring now to FIG. 2, there is shown a method of molding the casing 17 of FIG. 1A over the substrate 12. A similar procedure could be used for the casing 17A of FIG. 1B, although other casing forming techniques, such as transfer molding, may also be used. Once the circuit substrate 12 has been fabricated with circuit patterns 19 and 30, and plated through holes 28 (see FIG. 1A) connecting the patterns, the substrate 12 is placed within a molding apparatus 100 adapted for forming the casing 17 thereon. The molding apparatus 100 includes a mold housing 102 specifically designed to form casing 17 as shown and for receiving the injection of the suitable thermoplastic 14 onto the circuit substrate 12. The casing 17 is molded in a manner which covers a designated region of the circuit substrate 12, often over a plurality of inner lead trace fingers 24, as well as a portion of each one of the plurality of intermediate lead trace portions 25 (see FIG. 1A). The suitable thermoplastic 14 is injected so that the casing 17 is formed to define a cavity 18 including, in part, cut-out 18A (see FIGS. 1A, 1B) of substrate 12. Cavity 18 then includes a plurality of substantially vertical walls 32 upstanding from the substrate 12. The vertical walls 32 may then function, in part, as a resin dam for encapsulant injected into cavity 18, as described below.

Still referring to FIG. 2, during the above-described molding process, the suitable thermoplastic 14 is in a molten state and is forced through injection ports 104 into mold cavity 105. The mold cavity 105 is defined between fixed mold base 107 and moveable platen 109 which together comprise housing 102. A venting port 106 is also shown in this particular view. The molten state of thermoplastic 14 provides a substantial remelting of the adjacent portion of the top surface 19A of the circuit substrate 12. The remelting of the top surface 19A (see FIGS. 1A, 1B) of circuit substrate 12 provides a chemical fusing or bonding of portions of the circuit substrate 12 to the casing 17. The fusion then provides a moisture and chemical barrier, substantially equal to that of the suitable thermoplastic 14 itself.

Referring back to FIG. 1A, after the molding process has been completed heat sink 16 may be secured to the substrate 12 and one or more chips 34 may be attached to the heat sink. The chip(s) 34 is attached to the heat sink 16 with an adhesive material 35. A curing process (as required) is applied to the adhesive material 35 which results in an adhesive mechanical attachment of the chip 34 to the heat sink 16. After the attachment of the chip 34, a plurality of fragile wires 26 are connected between the plurality of inner lead trace fingers 22 and a plurality of electrical connection pads 38 of the chip 34.

Referring to FIGS. 1A and 1B in combination, the heat sink chip carrier packages 10 and 10A of the present invention may be seen to provide an improved assembly for the mounting of a heat sink to a substrate and the reliable protection of semiconductor devices mounted thereto from the environment. What is not shown in FIGS. 1A and 1B is the preferable use of a lid or encapsulant around the semiconductor devices and upon the heat sinks. These aspects will be described in more detail below. It may be seen, however, that the fabrication of the casing 17 and 17A as an integral element of the assembly of the heat sink 16 and substrate 12 and 12A through the bonding therebetween will afford improved structural reliability and versatility in the manufacture of chip carrier packages. The present design affords the package designers and manufacturers an opportunity to use the most appropriate encapsulants, or other encapsulation techniques within the cavity 18 formed by the casing 17 and 17A, relative to the particular end use of the product.

Figure 3:
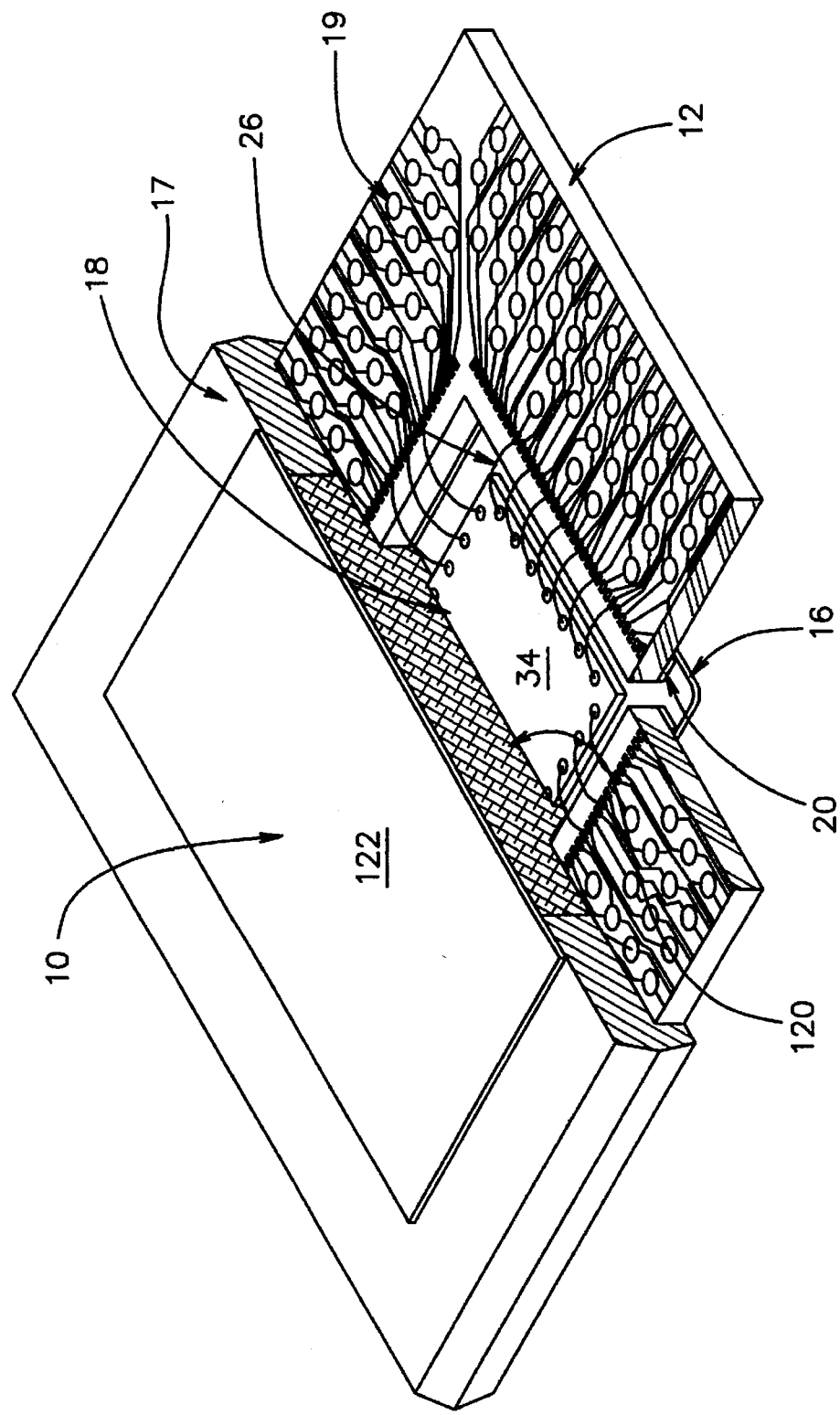
FIG. 3 is an enlarged, fragmentary perspective view of an alternative embodiment of the thermally enhanced chip carrier package of the present invention.

Referring now to FIG. 3, there is shown an alternative embodiment of the package configurations for the chip carrier package 10 of FIG. 1A. FIG. 3 is a fragmentary perspective of the package of FIG. 1A with an encapsulant 120 filling cavity 18. Portions of the casing 17, substrate 12 and encapsulant 120 are removed (as shown by section lines) for purposes of clarity. In FIG. 3 the casing 17 is disposed upon the substrate 12 around the underlying heat sink 16. A mounting ring 20 is utilized for heat sink 16 as described above. The casing 17 forms a dam for the encapsulant 120 which is dispensed therein covering the chip 34, heat sink 16, wires 26 and metal pattern 19. A lid 122 is disposed over the encapsulant 120 and sealed to the casing 17 as will be described below. The following alternative embodiments are also presented for illustrating a variety of packaging approaches in accordance with the principles of the present invention.

Figure 4:
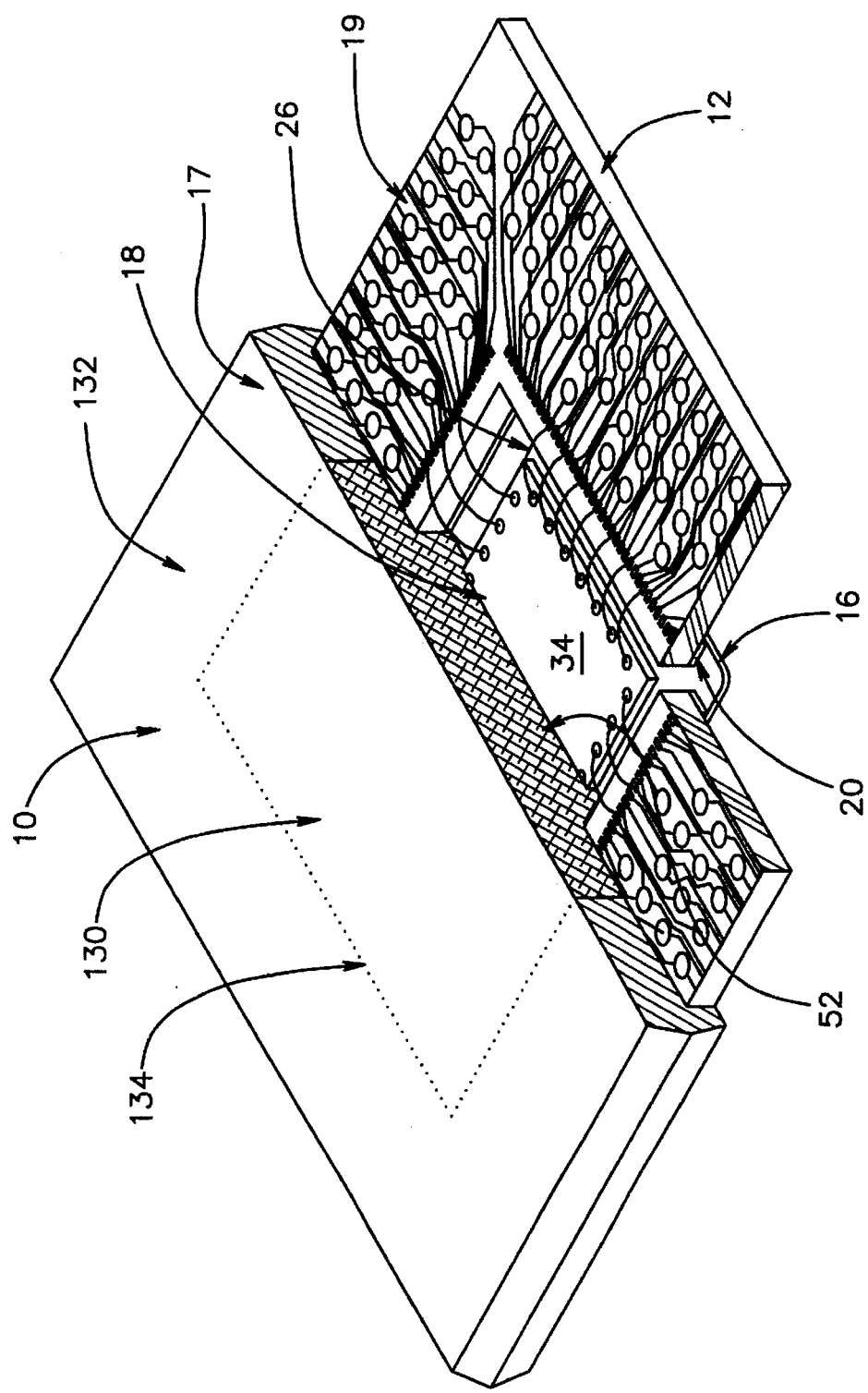
FIG. 4 is a fragmentary, cut-away perspective view of an alternative embodiment of the package of FIG. 3.

Referring now to FIG. 4, there is shown the heat sink chip carrier package 10 of FIG. 1A in a fragmentary perspective view thereof with chip 34 secured therein and encapsulated in a liquid encapsulant 52, which may be the same as encapsulant 120 of FIG. 3. Mounting ring 20 is also shown securing heat sink 16. The liquid encapsulants may vary in type and include RTV, epoxy and silicone, which encapsulants are commonly used today as overcoatings and liquid fills. Because of the presence of casing 17 about the circuit substrate 12, a variety of encapsulation techniques may be utilized for protecting the chip 34, wires 26 and pattern 19 in comparison to other prior art chip carrier cavity packages. In this particular embodiment, a lid 130 is recessed within the cavity 18 (formed in part by the casing 17) upon the encapsulant 52 to provide a flush top 132. The lid 130 may be separately formed for placement on the encapsulant 52 and securement thereto by a suitable adhesive, including the encapsulant itself. The lid 130 may also be formed by injection molding the thermoplastic material directly over the encapsulant 52. This molded lid 130 will then fuse to the casing 17 forming a homogenous surface. Dotted lines 134 are provided to diagrammatically illustrate the intersection between the lid 130 and casing 17. The method of bonding is discussed below.

Figure 5:
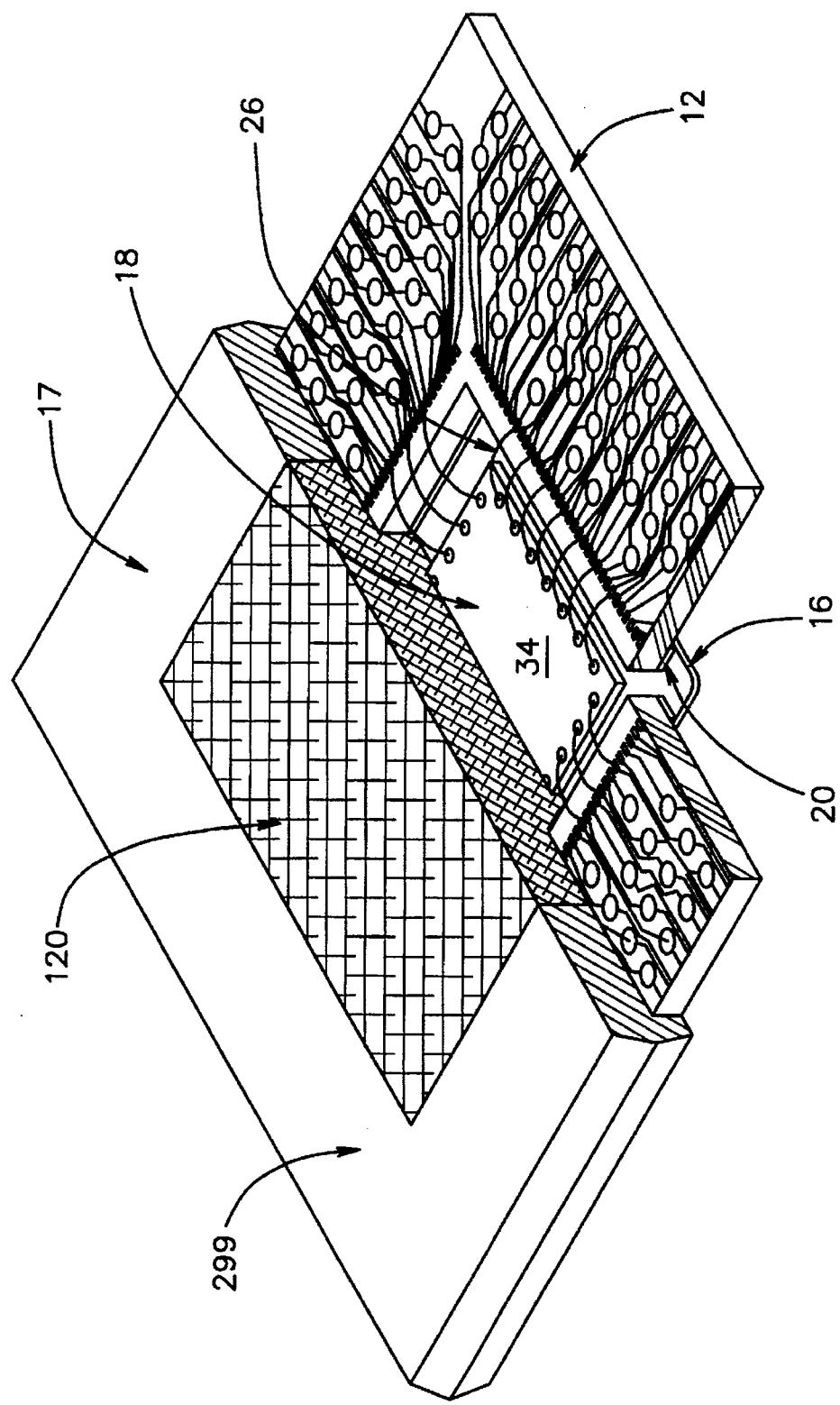
FIG. 5 is a fragmentary, cut-away perspective view of an alternative embodiment of the package of FIG. 3.

Referring now to FIG. 5, there is shown an alternative embodiment of the liquid encapsulation assembly of FIG. 3 wherein no lid is utilized upon the encapsulant 120. A package 299 is thus provided with a variety of advantageous features. The chip 34 is protected from the environment by the encapsulant 120 filling the cavity 18 within the casing 17 and further bonded to the substrate 12 and the heat sink 16 over wires 26. A variety of combinations of material and/or bonding techniques may be utilized in accordance with the principles of the present invention as described below.

Figure 6:
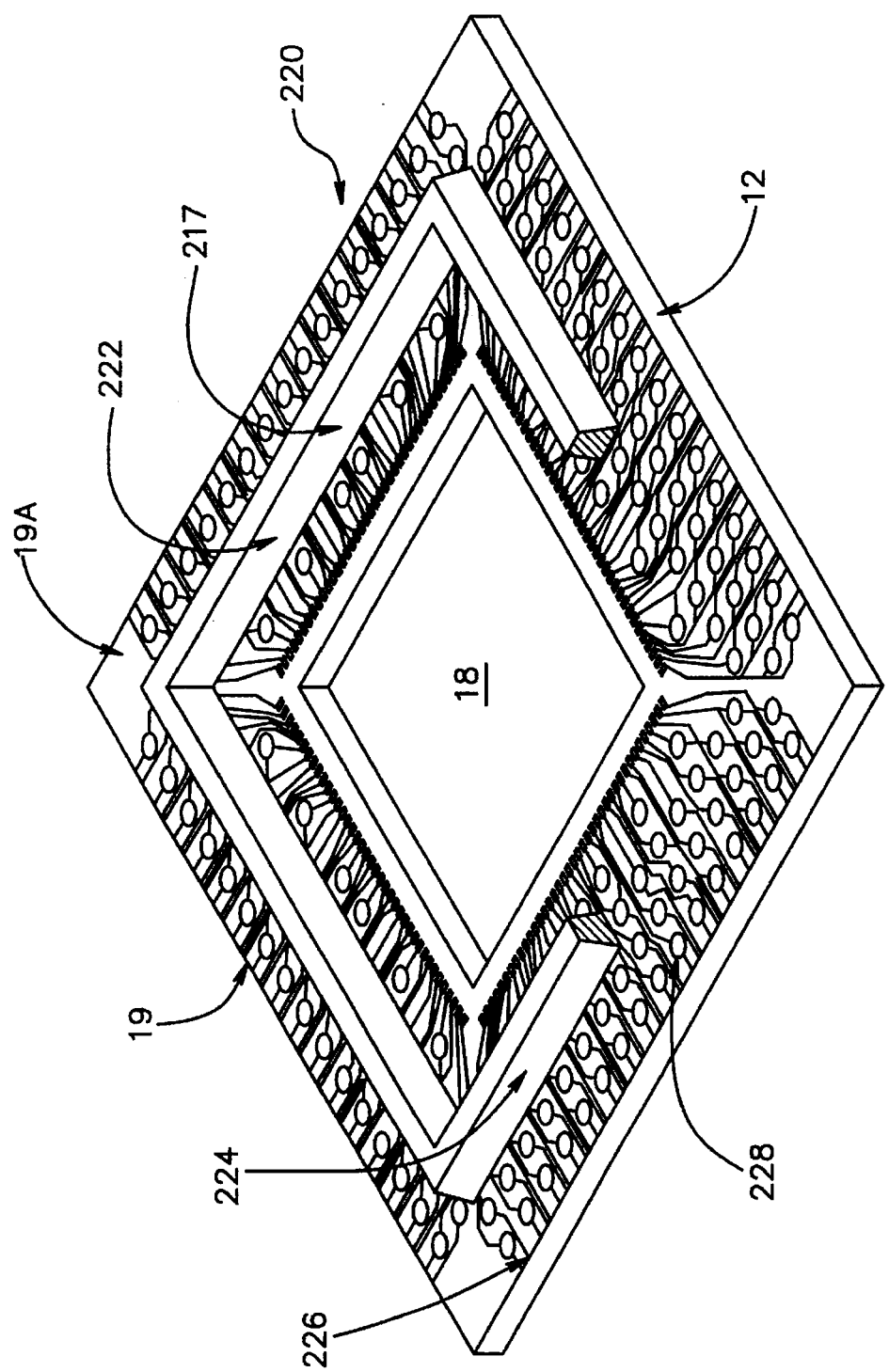
FIG. 6 is a fragmentary, perspective view of an alternative embodiment of the package of FIG. 3.

Referring now to FIG. 6, there is shown an alternative embodiment of portions of a heat sink carrier package constructed in accordance with the principles of the present invention. A segmented casing 217 in the form of the segmented casing 17A of FIG. 1B is shown and secured to the top side 19A of circuit substrate 12 of a heat sink chip carrier package 220. The segmented casing 217 is much smaller, and particularly narrower than the casing 17 of FIG. 1A and covers a lesser portion of the metal pattern 19. The inside walls 222 of casing 217 are positioned in approximately the same location as the inside walls of casing 17 of FIG. 1A relative to the substrate 12. The outside walls 224 are recessed inwardly from the perimeter 226 of substrate 12. In this location, outer portions 228 of pattern 19 are exposed after assembly of a heat sink, a chip and an encapsulant (none of which being shown for purposes of clarity) to the substrate 12. The encapsutant may, as described above, be dispensed into the cavity 18 and contained by the inside walls 222. One advantage of this particular embodiment is the fact that the casing 217 of package 220 may be strip molded, which technique is conventional in the industry. Another advantage is that the casing 217 requires less material volume and the associated expense of the thermoplastic material used to form said casing. If a thermoplastic material such as PPS or LCP is used for the substrate 12 and casing 217, said casing may be chemically fused to the substrate 12 during the injection molding process.

Figure 7:
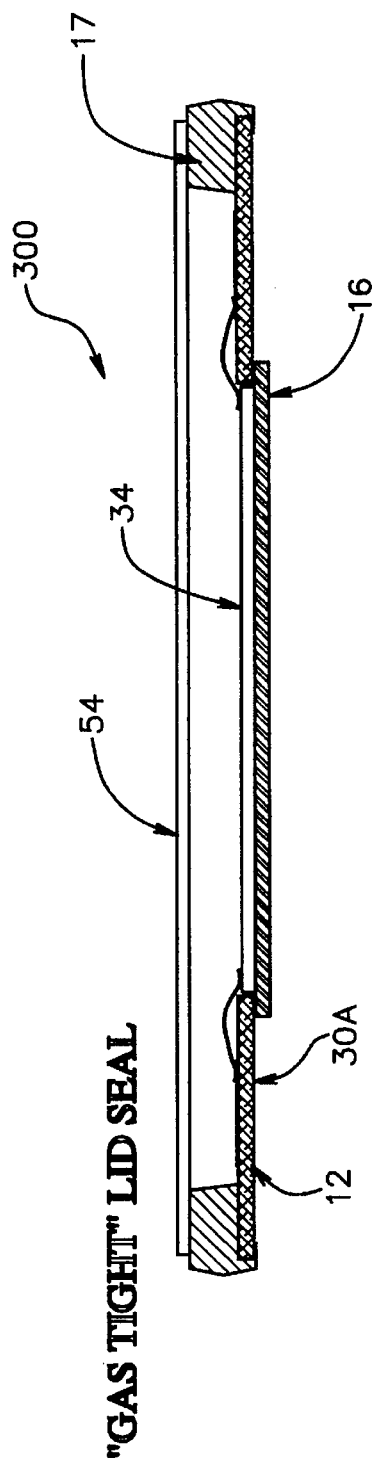
FIG. 7 is a side-elevational, cross-sectional diagrammatic view of an alternative embodiment of the package of FIG. 1A.

Referring now to FIG. 7, there is shown a diagrammatic, side-elevational, cross-sectional view of an alternative embodiment of a heat sink carrier package constructed in accordance with the principles of the present invention. A conventional chip 34 is secured to a heat sink 16 secured to the bottomside 30A of substrate 12 (as shown in FIG. 1A) to form gas tight lid seal package 300. In this particular embodiment, lid 54 is secured atop the casing 17 in a "gas tight" configuration without the presence of a liquid encapsulant therein. The gas tight lid seal may be provided by a variety of techniques as described below. One of the techniques, in accordance with the principles of the present invention, is to fabricate the lid 54 from the same thermoplastic from which the casing 17 is formed whereby the lid 54 may be chemically fused to the casing 17 by utilizing heat or the like.

Figure 8:
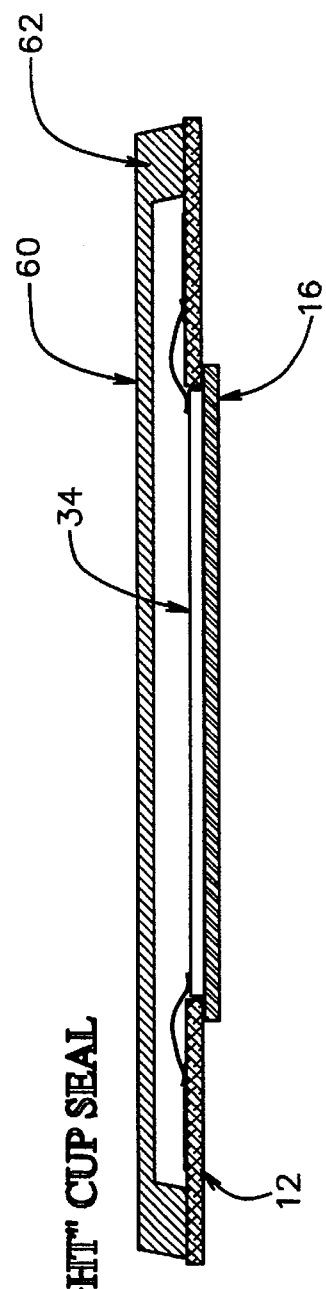
FIG. 8 is a side-elevational, cross-sectional diagrammatic view of an alternative embodiment of the package of FIG. 1A.

Referring now to FIG. 8, there is shown yet an alternative embodiment of the securement of a chip 34 to a substrate 12 in accordance with the principles of the present invention. In this particular diagrammatic, side elevational view, a cup seal lid 60 is provided having side walls 62 of a width substantially equivalent to the width of the side walls of the casing 17 as shown in FIG. 7. By fabricating the cup seal lid 60 from the same thermoplastic material from which the substrate 12 is formed, the bonding of the cup seal lid 60 to the top surface of the substrate 12 may be affected by heat or the like to form a chemical fusion therebetween and provide the advantageous results described above for protecting the chip 34 therein.

Figure 9:
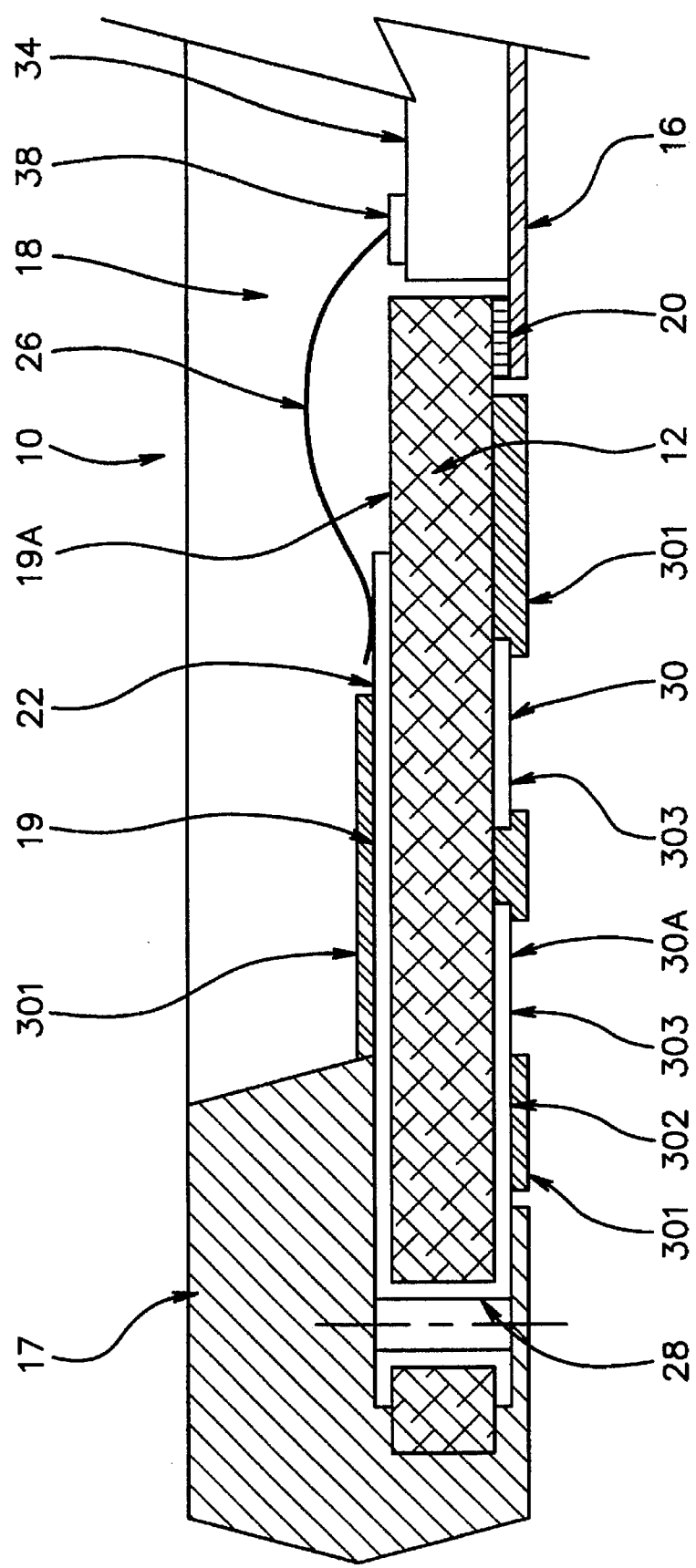
FIG. 9 is an enlarged, fragmentary, side-elevational, cross-sectional view of a portion of the package of FIG. 1A.

Referring now to FIG. 9, there is shown an enlarged, side-elevational, cross sectional view of a portion of the casing 17 and substrate 12 of the heat sink chip carrier cavity package 10 of FIG. 1A. In this view it may be seen that the plated through holes 28 establish the electrical connection between the circuit pattern 19 on the top side 19A and the circuit pattern 30 on the bottom side 30A of substrate 12. Plated through holes may not be required with the embodiment of FIG. 1B. It may be seen that by utilizing a common thermoplastic material in both embodiments, the adherence of the casing 17 to the substrate 12 effectively eliminates any possibility of moisture infiltration into a chip mounted on the heat sink 16.

Referring still to FIG. 9, substrate 12 is fabricated with metal patterns 19 and 30, first portions of which being electrically connected by plated through holes 28 and second portions of which being covered with a mask 301. A series of land areas 303 are provided for electrical interconnection to the carrier package 10. In this particular view, the heat sink 16 is shown to be mounted to the underside 30A of substrate 12 through mounting ring 20, which is part of metal surface pattern 302 that permits the heat sink 16 to be directly soldered to the substrate 12. The use of a separate surface pattern 302 (of which mounting ring 20 is a part) enables the heat sink 16 to be secured to the substrate 12 without the use of adhesives or the like. This securement technique also provides enhanced moisture resistance to the assembly, because adhesives, such as epoxy, absorb moisture and allow quicker penetration of moisture into the cavity 18. There are other problems with adhesives which could otherwise be used to bond the heat sink. For example, adhesives often bleed into unwanted areas during application. Additionally, adhesives have limited temperature capacity and may not meet the temperature requirements of further processing such as soldering.

Figure 10:
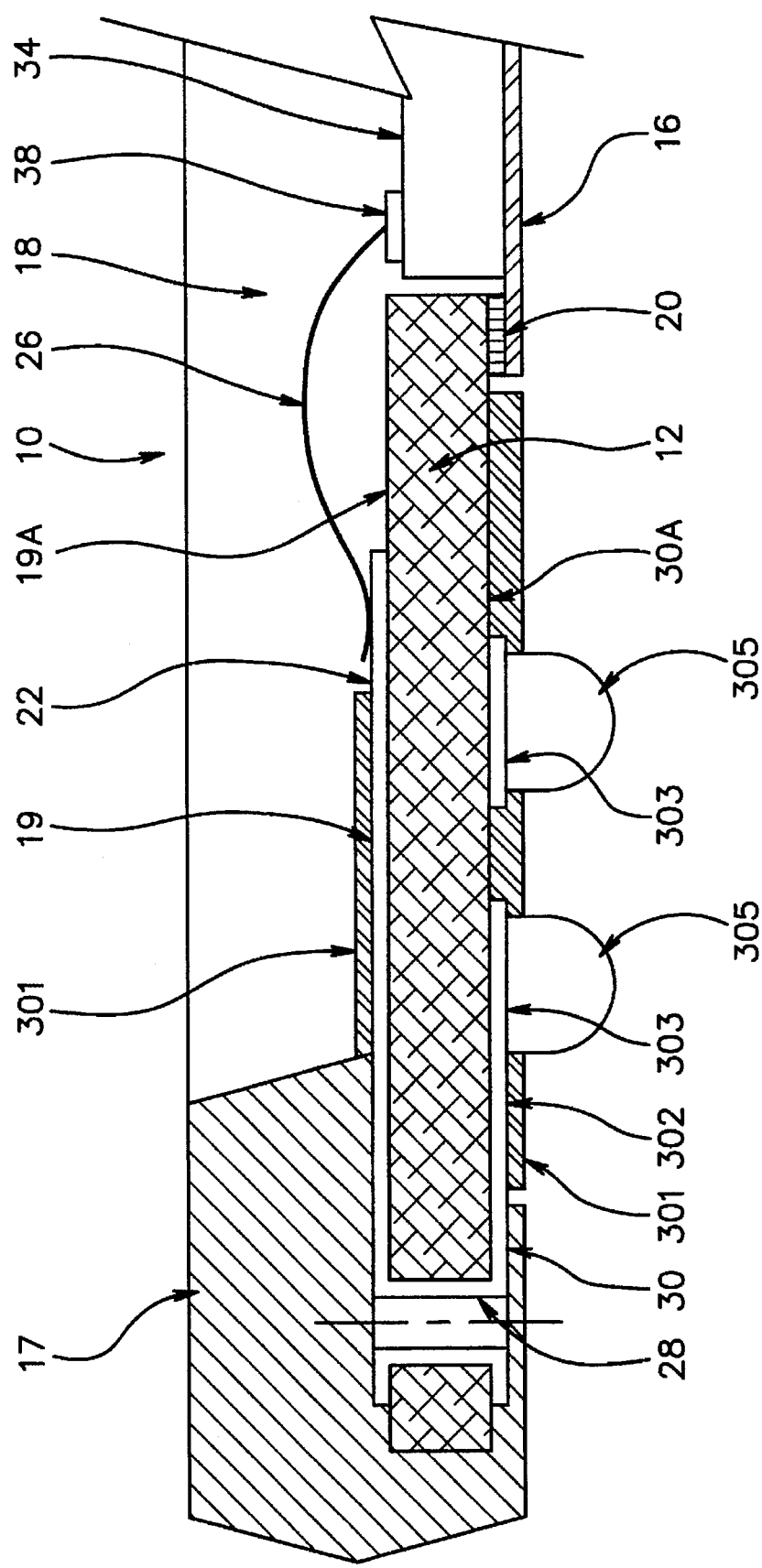
FIG. 10 is an alternative embodiment of the package of FIG. 9.

Referring now to FIG. 10 there is shown an alternative embodiment of the assembly of FIG. 9. The casing 17 surrounding cavity 18 with chip 34 secured therein on heat sink 16 is further enhanced by a series of solder balls 305 secured to the land areas 303 of substrate 12. Electrical connection to the solder balls 305 is provided from the wires 26 connected to pattern 19 of top side 19A, through the plated through hole 28 and across the pattern 30 of side 30A. The land areas 303 are part of pattern 30 and afford a useful electrical connection system. Mounting ring 20 is again shown securing heat sink 16 to the substrate 12.

Figure 11:
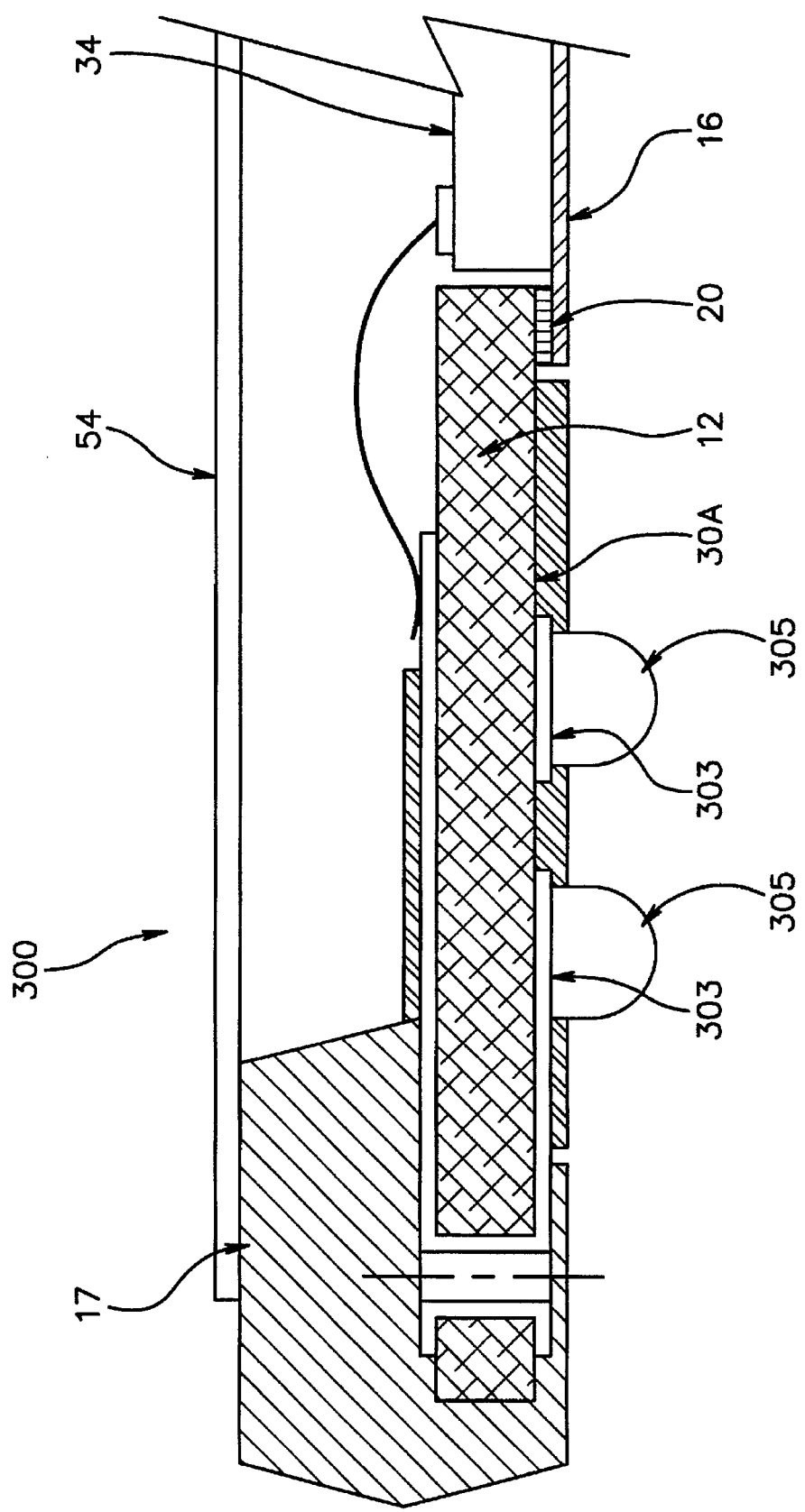
FIG. 11 is an enlarged, fragmentary, side-elevational, cross-sectional view of a portion of an alternative embodiment of the package of FIG. 7.

Referring now to FIG. 11 there is shown an enlarged, side-elevational, cross sectional view of an alternative embodiment of the package 300 of FIG. 7. Again, heat sink 16 is secured to substrate 12 by mounting ring 20. Solder balls 305 have been attached to the land areas 303 described in FIGS. 9 and 10. Lid 54 has been secured to the casing 17 to create a gas tight seal. A preferable method of securement is fabricating both the casing 17 and lid 54 of the same thermoplastic material and applying sufficient heat for chemical fusion. The use of other adhesives could also be included.

Figure 12:
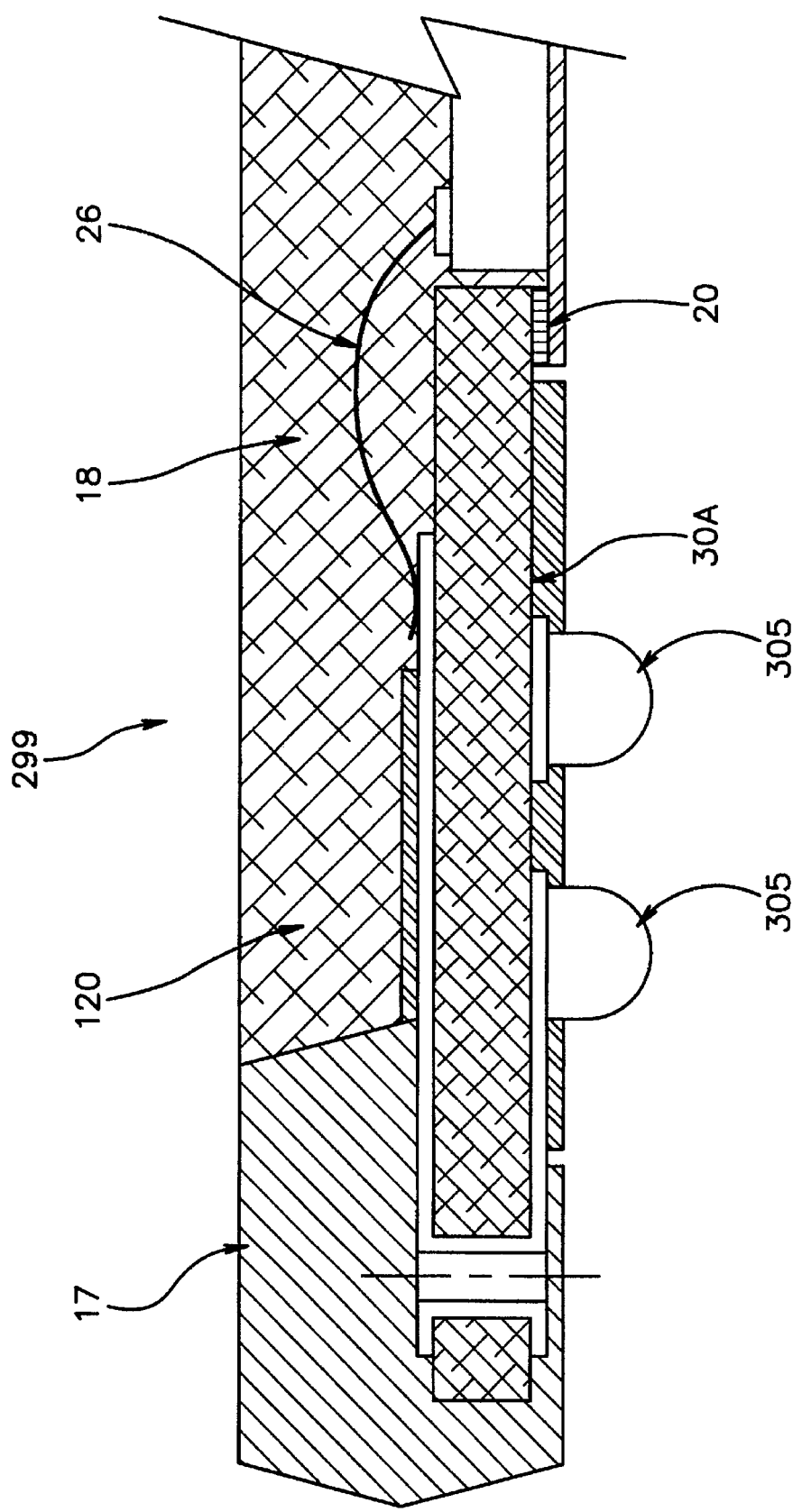
FIG. 12 is an enlarged, fragmentary, side-elevational, cross-sectional view of a portion of the package of FIG. 5.

Referring now to FIG. 12 there is shown an enlarged, side-elevational, cross sectional view of the package 299 of FIG. 5 with solder balls 305 depending from surface 30A. Encapsulant 120 is shown filling the cavity 18 to the top of casing 17. The wires 26 are protected from the environment by the encapsulant 120. The manner of filling cavities with encapsulants is conventional in the art and further description is not deemed necessary.

Figure 13:
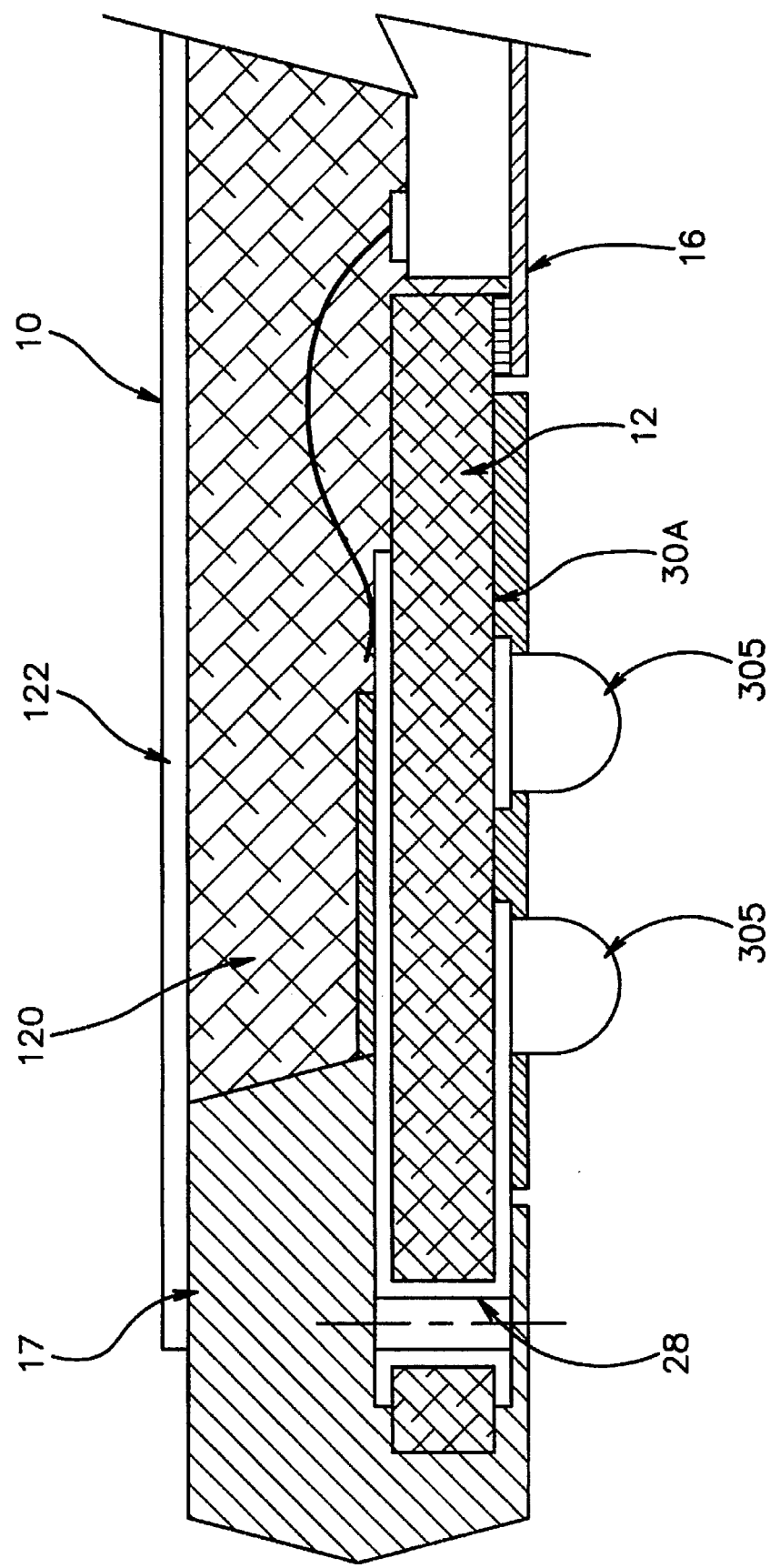
FIG. 13 is an enlarged, fragmentary, side-elevational, cross-sectional view of a portion of the package of FIG. 3.

Referring now to FIG. 13 there is shown an enlarged side-elevational, cross sectional view of the package 10 of FIG. 3 with solder balls 305 depending from surface 30A. The lid 122 extends over encapsulant 120 and is bonded to the top of casing 17. The lid 122 may be bonded as described above in FIG. 12. It may be seen in this view and FIG. 12 that the solder balls 305 are not disposed over the plated through hole 28.

Figure 14:
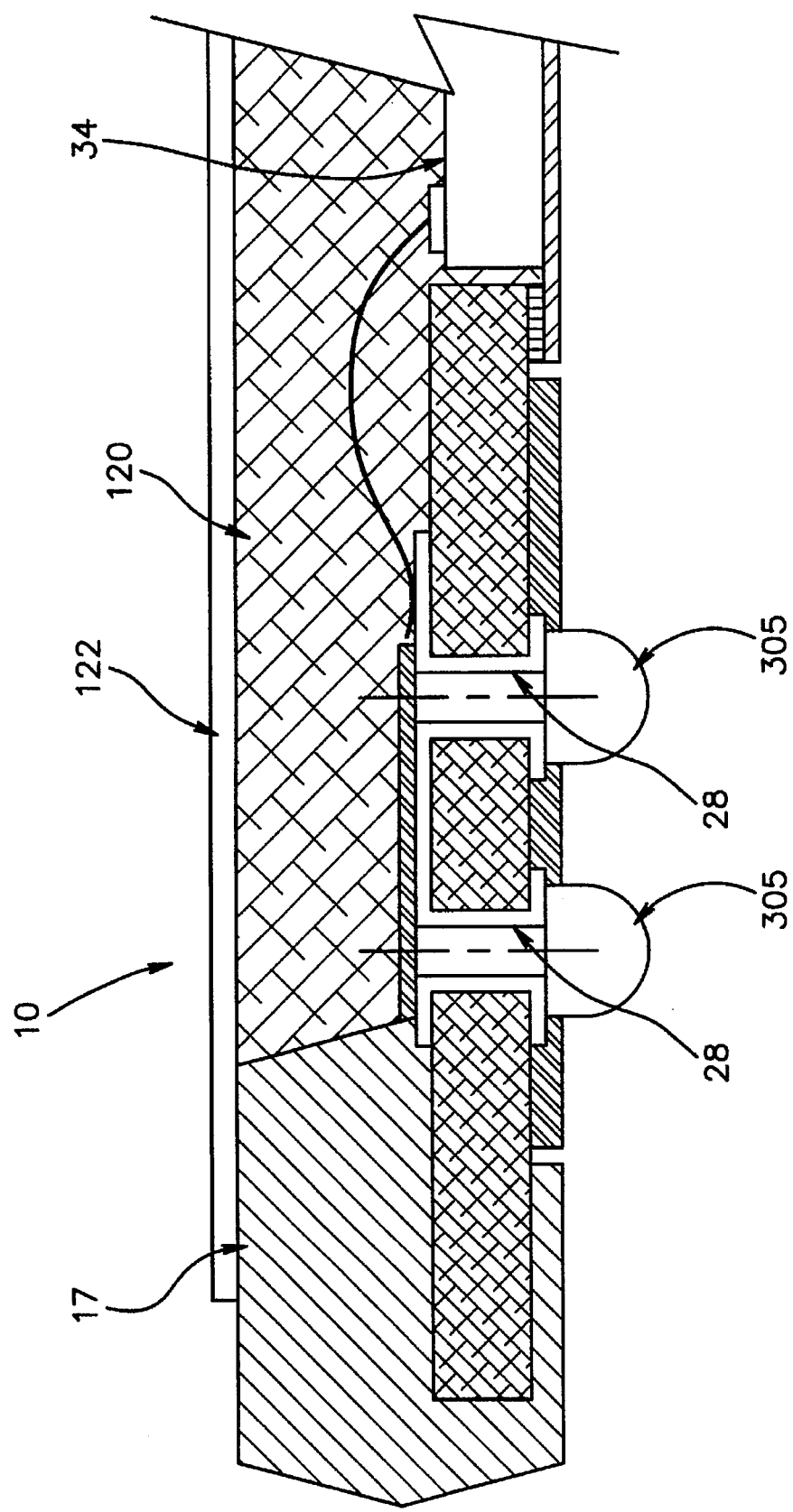
FIG. 14 is an alternative embodiment of the package of FIG. 13.

Referring now to FIG. 14, there is shown an alternative embodiment of the package 10 of FIG. 13. Solder balls 305 are formed over and attached to the bottom side of plated through holes 28. All solder balls 305 of this particular illustration are deployed inwardly of casing 17, although this may not always be preferable.

Figure 15A:
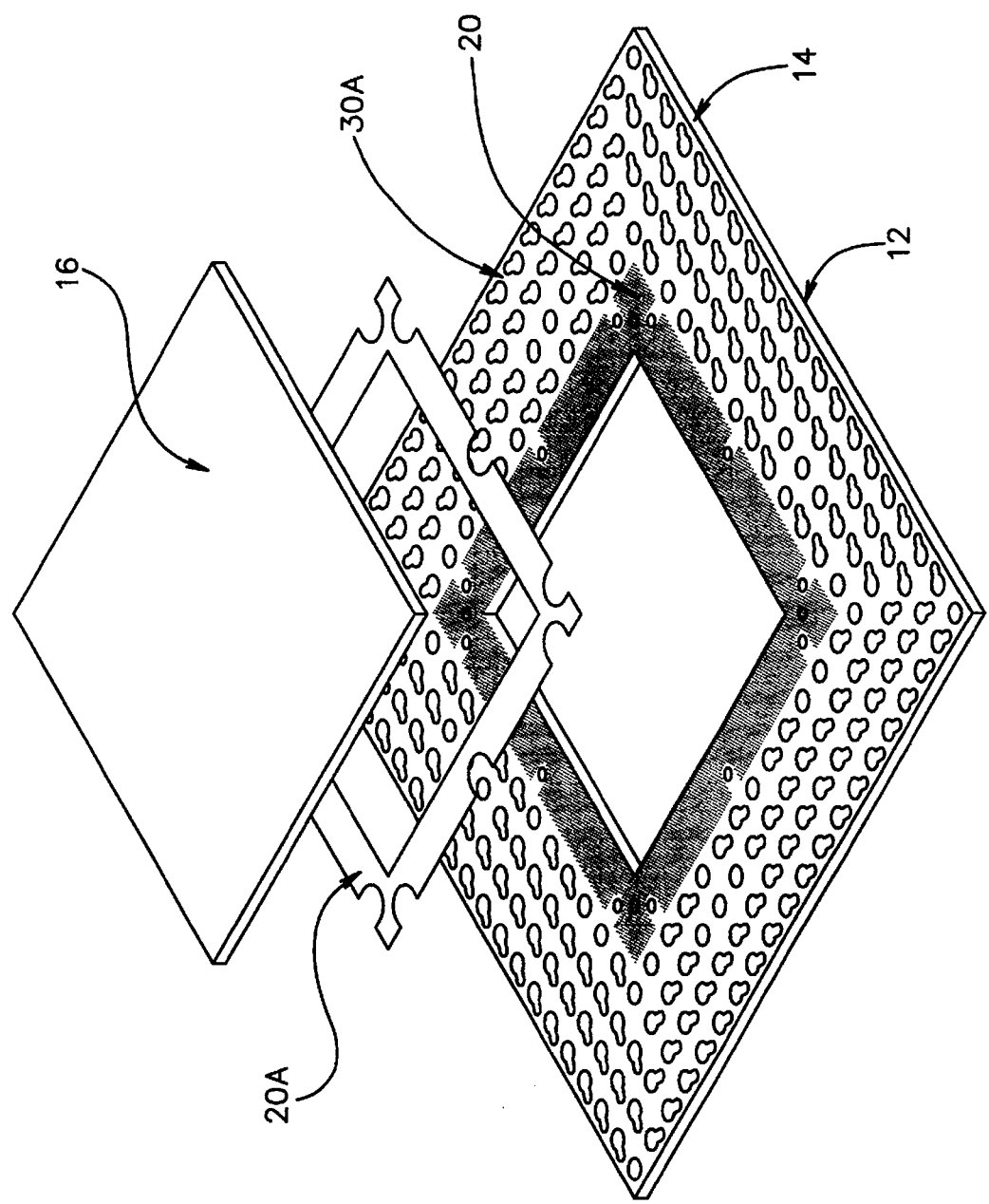
FIG. 15A is an enlarged, exploded, perspective view of the bottom of the package of FIG. 1A illustrating a solder ring and heat sink secured to the substrate thereof.

Referring now to FIG. 15A, there is shown a perspective view of the bottom 30A of the substrate 12 of FIG. 1A illustrating the securement of the heat sink 16 thereto. As shown in this particular embodiment, the heat sink 16 is secured to the bottom 30A of substrate 12 by mounting ring 20. The mounting ring 20 is formed of metal on substrate 12 outwardly of cavity 18 and provides means for securing said heat sink 16 thereto.

Still referring to FIG. 15A, there is shown a solder preform 20A above a mounting ring 20. The solder preform 20A is shown in position for application to the metal mounting ring 20 and comprises but one of a variety of techniques for applying solder for securement of the heat sink 16 to the substrate 12. The utilization of solder preforms 20A may, in certain applications, be preferable because the preform shape can be specifically created, aligned and placed upon the mounting ring 20 with appropriate alignment fixtures (not shown). Other solder application techniques also exist in accordance with existing industry standards. For example, solder may be dispensed upon the mounting ring 20 in a paste form by a syringe or the like. Solder may also be applied through a silk screen onto the mounting ring 20. Each technique has its advantages and disadvantages and the cost effectiveness thereof depends upon volume and other manufacturing considerations. Notwithstanding the above, once solder has been applied to the mounting ring 20, the utilization of appropriate heat will cause said solder to bond both the mounting ring 20 and the heat sink 16 secured thereagainst. The application of heat and related solder techniques are conventional in the industry and further description is not deemed necessary. One aspect of such solder techniques is, however, important to note. The exposure of the heat sink 16 and related assembly to soldering results in exposure to the substantial heat. Depending on the type of solder selected, the necessary heat could range between 150° C. and 300° C. The substrate material 14 must therefore be able to remain stable at such temperatures while the solder is being melted. In most cases, a temperature range between 180° and 240° C. is acceptable, where PPS and LCP or similar thermoplastics are stable in a continuous operating mode.

Figure 15B:
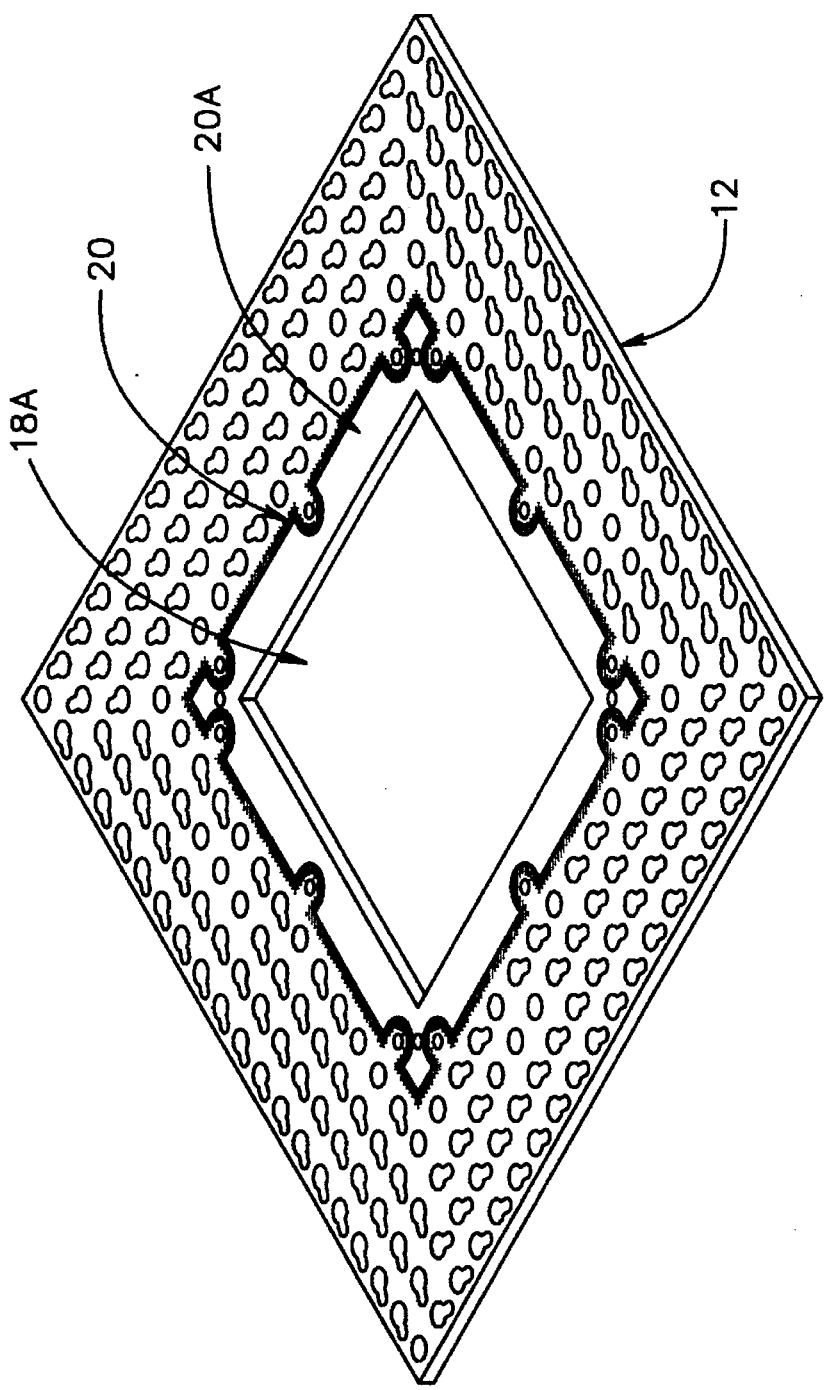
FIG. 15B is a perspective view of the bottom of the substrate of the package of FIG. 1A with the heat sink removed and illustrating the solder ring thereon.

Referring now to FIG. 15B, there is shown the substrate 12 of FIG. 15A before the heat sink 16 is applied. The mounting ring 20 is more completely shown and may be seen to comprise an enlarged region surrounding the cut-out 18A. As discussed above, only the mounting ring 20, solder, and standard soldering procedures are required for attachment of heat sink 16 to the substrate. In this view, the solder 20B has been applied to the ring 20. The assembly is now ready for positioning of the heat sink 16 (shown in FIG. 15A). The outer periphery of mounting ring 20 is shown around the solder 20B.

Figure 16A:
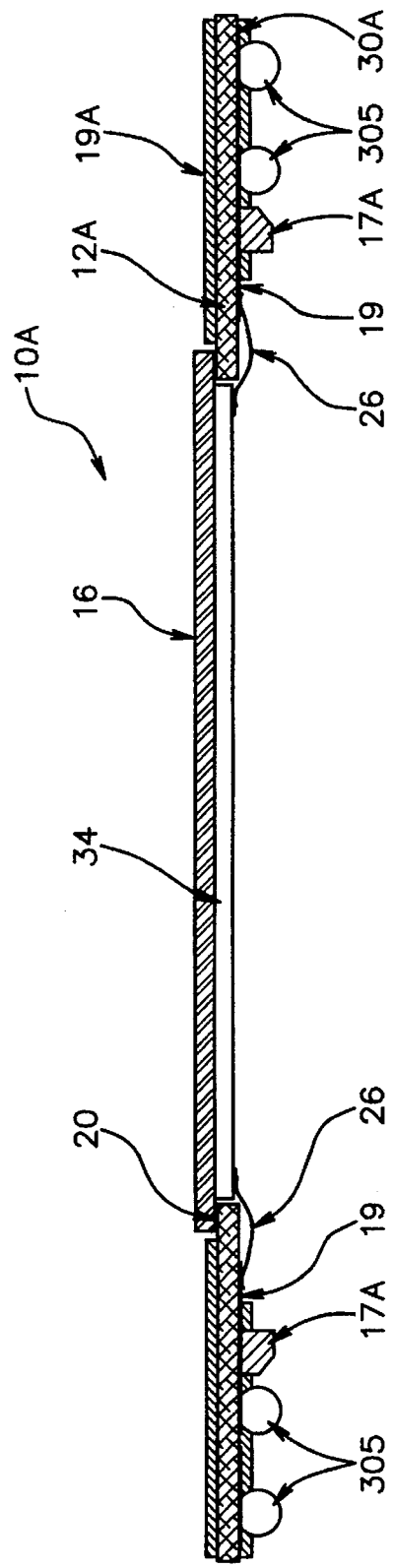
FIG. 16A is a side-elevational, cross-sectional view of the package assembly of FIG. 1B.

Referring now to FIG. 16A, there is shown an enlarged, side-elevational, cross-sectional view of the package 10A of FIG. 1B. In this illustration it may be seen that the top 19A of substrate 12A has secured thereon the heat sink 16 while the bottom 30A has depending therefrom solder balls 305.

The mounting ring 20 is clearly shown securing said heat sink 16 to said substrate 12A. The chip 34 is downwardly oriented from the heat sink 16 and fragile wires 26 extend from the chip 34 to the circuit pattern 19 formed on side 30A. Segmented casing 17A likewise extends from substrate 12A around the wires 26. As described above, the circuit pattern 19 provides interconnection between the fragile wires 26 extending from chip 34 to the select solder ball 305 providing appropriate electrical interconnection therewith.

Figure 16B:
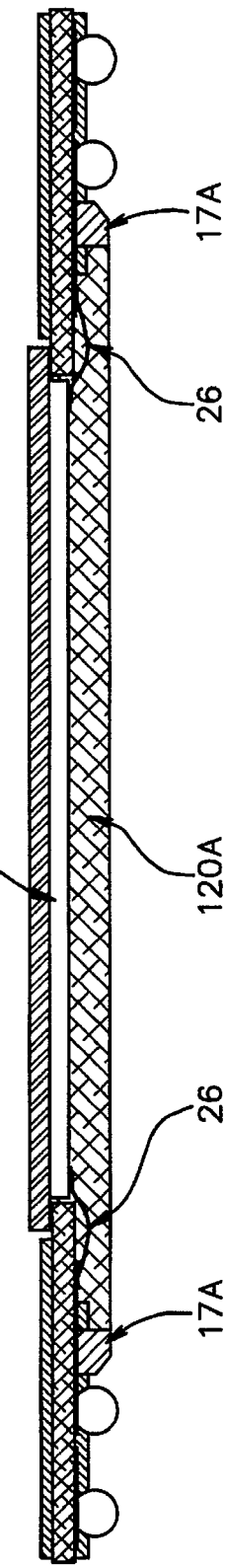
FIG. 16B is a side-elevational, cross-sectional view of the package assembly of FIG. 16A with encapsulant injected thereon.

Referring now to FIG. 16B, there is shown a side-elevational, cross-sectional view of the package 10A of FIG. 16A illustrating one encapsulation configuration thereof. As shown therein, an encapsulant 120A has been applied within the segmented casing 17A for protection and sealing of the chip 34 and fragile wires 26 extending therefrom. This particular encapsulation configuration is but one illustration of the principles of the present invention as utilized in a downwardly oriented chip configuration. A variety of lids, encapsulants and sealing techniques can be used, and these are described above for the package 10.

Referring now to FIG. 17A, there is shown a side-elevational, cross-sectional view of a chip carrier package 410 comprising an alternative embodiment of the package 10 of FIG. 16A. Package 410 comprises a multilayer substrate 412 formed with multiple metal layers, a top loaded heat sink 16, and a downwardly extending casing 417 surrounding around a chip 34. Multilayer substrate 412 as shown in this view thus includes metal layers 414 and 416 disposed between the top and bottom surfaces 418 and 420, respectively, of the substrate 412. Layers of the substrate 412 separate each of the aforesaid metal layers. The substrate layers include the suitable thermoplastic such as PPS or LCP in combination with the appropriate reinforcing mat such as glass fibers. Plated-through holes such as plated-through holes 422 and 424 are shown to interconnect select ones of the metal layers 414 and 416. The fabrication of a multilayer board is conventional in the art. The present invention is directed to the utilization of a mounting technique for a heat sink 16 in association with such a substrate assembly.

Referring now to FIG. 17B, there is shown a side-elevational, cross-sectional view of the package 410 comprising an alternative embodiment of the package 10A of FIG. 16B with encapsulant 430 molded over chip 34. Casing 417 depends from the bottom surface 420 of the substrate 412 while providing a means for containing the encapsulant 430 therein. As described in FIG. 16B a variety of lids and other sealant configurations are contemplated by the present invention in accordance with the discussions set forth above.

It may be seen that the present invention utilizes a heat sink 16 to form a thermally enhanced chip carrier package in a variety of configurations. A wide assortment of encapsulants and lid assemblies may be utilized in accordance with the principles of the present invention. It is preferable in one embodiment to use a common homogeneous material for the fabrication of casings 17 and 17A and substrates 12 and 12A as well as the lid 54. Other combinations of materials may be used. Lid 54 may, for example, be metal and a specific adhesive may be utilized for bonding the casings 17 and 17A to the lid 54. When a common homogeneous material is utilized, such as PPS or LCP, the application of heat will cause a remelting along the surface interface and a chemical fusing to create a seal therebetween that is substantially impervious to moisture infiltration. This is a marked advancement over the prior art. In addition, the utilization of the casings 17 and 17A around the heat sink 16 affords the flexibility of utilizing a variety of encapsulants. In addition, appropriate heat dissipation from the chip 34 can be effected by the heat sink 16 upon which the chip 34 is mounted. This marked advance over prior art configurations affords versatility and flexibility in both the manufacturing process and product reliability. Although PPS and LCP are described as being preferred, other thermoplastic materials may also be utilized in accordance with the principles of the present invention.

While it is believed that the operation and construction of the system of the present invention will be apparent from the foregoing description, the method of operation and structure of the system shown and described has been characterized as being preferred and obvious changes and modifications may be made therein without departing from the spirit and scope of the invention as defined in the following claims.

What is claimed is:

1. A thermally enhanced chip carrier package for housing at least one integrated circuit chip, said package comprising:
   a circuit substrate having a central aperture formed therein;
   a heat sink adapted for mounting said at least one integrated circuit chip thereto;
   means for securing said heat sink to one side of said circuit substrate across said central aperture, said means comprising:
      a metallic ring formed on said circuit substrate around said central aperture adapted for the securement of said heat sink thereto, and
      solder placed upon said metallic ring for securing said heat sink thereto;
   said circuit substrate comprising a suitable thermoplastic material with a plurality of metal lead traces formed on at least one side thereof; and
   a casing comprised of said suitable thermoplastic material and covering a portion of said circuit substrate so that a cavity is formed around and through said central aperture, said casing being chemically fused to a portion of said circuit substrate around said central aperture.

2. The package of claim 1 wherein a chip mounting region is formed on said heat sink in a portion thereof defined by said central aperture of said circuit substrate.

3. The package of claim 1 wherein said suitable thermoplastic material comprises polyphenylene sulfide.

4. The package of claim 1 wherein said suitable thermoplastic material comprises liquid crystal polymer.

5. The package of claim 1 and further including a lid adapted for placement over and securement to said casing.

6. The package of claim 5 wherein said lid is formed of said suitable thermoplastic material and is chemically fused to said casing.

7. The package of claim 5 wherein said lid is formed of metal and is secured to said casing by an adhesive.

8. The package of claim 1 wherein said plurality of metal lead traces are found on a top side of said circuit substrate, said heat sink is secured to a bottom side of said circuit substrate and said circuit substrate further includes a plurality of metal electrical contact points formed on one side thereof outwardly of said metallic ring and further including means for connecting said plurality of metal lead traces on said top side to said plurality of metal electrical contact points of said circuit substrate.

9. The package of claim 1 wherein said plurality of metal lead traces are formed on a bottom side of said circuit substrate, said heat sink is secured to a top side of said circuit substrate and said circuit substrate further includes a plurality of metal electrical contact points formed on said circuit substrate outwardly of said central aperture.

10. The package of claim 1 and further including a liquid encapsulant disposed within said casing for protection of a chip mounted to said heat sink.

11. The package of claim 10 wherein said liquid encapsulant is an epoxy.

12. The package of claim 10 and further including a lid adapted for placement over and securement to said casing.

13. The package of claim 12 wherein said lid is secured to said casing with said liquid encapsulant.

14. The package of claim 12 wherein said lid is secured to said casing with an adhesive.

15. The package of claim 12 wherein said lid is formed of metal.

16. The package of claim 12 wherein said lid is formed of said suitable thermoplastic material and is chemically fused to said casing.

17. The package of claim 8 or 9 and further including solder balls attached to said plurality of metal electrical contact points of said circuit substrate.

18. The package of claim 1 wherein said metallic ring is solder coated to facilitate bonding to said heat sink by the application of heat.

19. A thermally enhanced chip carrier package for housing at least one integrated circuit chip, said package comprising:
   a circuit substrate formed with a suitable thermoplastic and including a center aperture formed therein, a plurality of lead traces disposed on one side of said circuit substrate outwardly of said center aperture, and a plurality of electrical contact points, disposed on said circuit substrate in electrical connection with said plurality of lead traces;
   a heat sink disposed across said center aperture and adapted for mounting said at least one integrated circuit chip thereto;
   a metal ring formed on said circuit substrate outwardly of said center aperture;
   solder placed upon said metal ring for securing said heat sink thereto;
   a casing, which is comprised of said suitable thermoplastic, said casing covering a portion of one side of said circuit substrate outwardly of said center aperture so that a cavity is formed outwardly of and through said center aperture, said casing being chemically fused to said portion of said circuit substrate outwardly of said center aperture; and
   means for securing at least one integrated circuit chip to said heat sink for positioning within said cavity.

20. The package as set forth in claim 19 wherein said plurality of lead traces are disposed on a bottom side of said circuit substrate, said plurality of electrical contact points are disposed on one side of said circuit substrate, and said metal ring is formed on a top side of said circuit substrate for the securement of said heat sink thereon.

21. The package as set forth in claim 20 wherein said plurality of lead traces are disposed on a top side of said circuit substrate, said plurality of electrical contact points are disposed on one side of said circuit substrate, said metal ring is formed on said bottom side of said circuit substrate for the securement of said heat sink thereto, and said package further includes means for connecting said plurality of lead traces to said plurality of electrical contact points.

22. The package of claim 21 wherein said connecting means comprises a plated-through hole formed in said circuit substrate.

23. The package of claim 19 and further including a lid adapted for placement over and securement to said casing.

24. The package of claim 23 wherein said lid is formed of said suitable thermoplastic.

25. The package of claim 23 wherein said lid is formed of metal and is secured to said casing by an adhesive.

26. The package of claim 19 and further including a liquid encapsulant disposed within said casing.

27. The package of claim 26 wherein said liquid encapsulant is an epoxy.

28. The package of claim 26 and further including a lid adapted for placement over said liquid encapsulant and securement to said casing.

29. The package of claim 28 wherein said lid is secured to said casing with said liquid encapsulant.

30. The package of claim 28 wherein said lid is secured to said casing with an adhesive.

31. The package of claim 19 wherein said suitable thermoplastic is chosen from the material group including liquid crystal polymer and polyphenylene sulfide.

* * * * *

UNITED STATES PATENT AND TRADEMARK OFFICE
CERTIFICATE OF CORRECTION

PATENT NO. : 5,650,593
DATED : Jul. 22, 1997
INVENTOR(S) : McMillan et al.

It is certified that error appears in the above-indentified patent and that said Letters Patent is hereby corrected as shown below:

Title Page, Item [57]
Abstract, line 2      Replace "semi-conductor"
                           With --semiconductor--

Title Page, Item [57]
Abstract, line 4      Replace "PPS or LCP"
                           With --polyphenylene sulfide or liquid crystal polymer--

Title Page, Item [57]
Abstract, line 7      Replace "aperture"
                           With --opening--

Title Page, Item [57]
Abstract, line 8      Replace "comprised"
                           With --made--

Column 1, line 15      Before "integrated"
                           Insert --semiconductor--

Column 9, line 23      Replace "encapsutant"
                           With --encapsulant--

UNITED STATES PATENT AND TRADEMARK OFFICE
CERTIFICATE OF CORRECTION

PATENT NO. : 5,650,593

DATED : Jul. 22, 1997

INVENTOR(S) : McMillan et al.

It is certified that error appears in the above-indentified patent and that said Letters Patent is hereby corrected as shown below:

Column 14, line 55  After "securing"
Insert --said--

Signed and Sealed this

Thirteenth Day of January, 1998

Attest:

BRUCE LEHMAN

*Attesting Officer*  *Commissioner of Patents and Trademarks*